(12) United States Patent
Kim

(10) Patent No.: US 11,373,722 B2
(45) Date of Patent: Jun. 28, 2022

(54) MEMORY DEVICE

(71) Applicant: SK hynix Inc., Icheon-si (KR)

(72) Inventor: Sang Hwan Kim, Icheon-si (KR)

(73) Assignee: SK hynix Inc., Icheon-si (KR)

(*) Notice: Subject to any disclaimer, the term of this patent is extended or adjusted under 35 U.S.C. 154(b) by 0 days.

(21) Appl. No.: 17/149,495

(22) Filed: Jan. 14, 2021

(65) Prior Publication Data

US 2022/0013188 A1 Jan. 13, 2022

(30) Foreign Application Priority Data

Jul. 9, 2020 (KR) .................. 10-2020-0084980

(51) Int. Cl.
*G11C 29/12* (2006.01)
*G11C 29/38* (2006.01)
*G11C 29/14* (2006.01)
*G11C 16/04* (2006.01)

(52) U.S. Cl.
CPC .......... *G11C 29/1201* (2013.01); *G11C 29/14* (2013.01); *G11C 29/38* (2013.01); *G11C 16/0483* (2013.01)

(58) Field of Classification Search
CPC ........ G11C 2029/5602; G11C 29/1201; G11C 29/38; G11C 29/14; G11C 16/0483; G11C 7/1063; G11C 7/109; G11C 16/10; G11C 29/12; G11C 29/12015
See application file for complete search history.

(56) References Cited

U.S. PATENT DOCUMENTS

| 5,204,837 | A | * | 4/1993 | Suwa | ..................... | G11C 29/46 365/201 |
| 5,768,290 | A | * | 6/1998 | Akamatsu | ............. | H01L 23/544 714/732 |
| 6,212,113 | B1 | * | 4/2001 | Maeda | ................. | G11C 7/1066 365/201 |
| 6,252,812 | B1 | * | 6/2001 | Maeda | ................. | G11C 7/1048 365/201 |
| 6,621,283 | B1 | * | 9/2003 | Matsuzaki | ............. | G11C 29/02 324/750.3 |
| 2002/0114186 | A1 | * | 8/2002 | Ito | ..................... | H01L 27/10841 365/185.13 |
| 2003/0035400 | A1 | * | 2/2003 | Adler | ..................... | G11C 29/56 370/338 |
| 2004/0047220 | A1 | * | 3/2004 | Itoh | ...................... | G11C 7/1072 365/222 |

(Continued)

FOREIGN PATENT DOCUMENTS

KR 1020000077284 A 12/2000
KR 100587052 B1 6/2006

*Primary Examiner* — Steve N Nguyen
(74) *Attorney, Agent, or Firm* — William Park & Associates Ltd.

(57) ABSTRACT

A memory device includes a first pad, a second pad, and a double data rate (DDR) test controller. The first pad may receive a write enable signal. The second pad may receive a data strobe signal. The DDR test controller is connected to the first pad and the second pad and outputs an internal write enable signal and an internal data strobe signal. The DDR test controller generates the internal data strobe signal based on the write enable signal received through the first pad, in at least a portion of a DDR test operation of the memory device.

21 Claims, 15 Drawing Sheets

(56) References Cited

U.S. PATENT DOCUMENTS

| | | | |
|---|---|---|---|
| 2004/0246801 A1* | 12/2004 | Lee ........................ | G11C 29/14 |
| | | | 365/221 |
| 2008/0259695 A1* | 10/2008 | Cho ..................... | G11C 7/1087 |
| | | | 365/189.05 |
| 2014/0241073 A1* | 8/2014 | Matsui ................. | G11C 7/1078 |
| | | | 365/191 |
| 2015/0012791 A1* | 1/2015 | Kim ........................ | G11C 29/36 |
| | | | 714/744 |
| 2019/0088348 A1* | 3/2019 | Jain ........................ | G11C 29/36 |

* cited by examiner

MEMORY DEVICE

CROSS-REFERENCE TO RELATED APPLICATION

The present application claims priority under 35 U.S.C. § 119(a) to Korean patent application number 10-2020-0084980, filed on Jul. 9, 2020, in the Korean Intellectual Property Office, the entire disclosure of which is incorporated herein by reference.

BACKGROUND

1. Technical Field

The present disclosure relates to an electronic device, and more particularly, to a memory device.

2. Related Art

A memory device may be formed in a two-dimensional structure in which strings are horizontally arranged on a semiconductor substrate, or in a three-dimensional structure in which the strings are vertically stacked on the semiconductor substrate. A three-dimensional memory device is a memory device designed in order to resolve a limit of integration of a two-dimensional memory device, and may include a plurality of memory cells that are vertically stacked on a semiconductor substrate.

The memory device may be tested by a test device in a wafer step. During a test operation of the memory device, a manufacturing cost of the test device may be reduced as the number of pads of the memory device connected to the test device is reduced.

SUMMARY

A memory device according to an embodiment of the present disclosure may include a first pad, a second pad, and a double data rate (DDR) test controller. The first pad may receive a write enable signal. The second pad may receive a data strobe signal. The DDR test controller may be connected to the first pad and the second pad and may output an internal write enable signal and an internal data strobe signal. The DDR test controller may generate the internal data strobe signal based on the write enable signal received through the first pad, in at least a portion of a DDR test operation of the memory device.

A memory device according to another embodiment of the present disclosure may include a memory cell array, a peripheral circuit, a control logic, and a double data rate (DDR) test controller. The memory cell array may include a plurality of memory cells. The peripheral circuit may perform a program operation, an erase operation, or a read operation on the memory cell array. The control logic may control an operation of the peripheral circuit. The DDR test controller may generate an internal write enable signal and an internal data strobe signal for being transferred to the control logic based on signals received from a first pad and a second pad. The DDR test controller may generate the internal write enable signal based on a first signal received through the first pad and may generate the internal data strobe signal based on a second signal received through the second pad, during a normal operation of the memory device. The DDR test controller may generate the internal data strobe signal based on the first signal received through the first pad in at least a portion of the DDR test operation of the memory device.

DETAILED DESCRIPTION

Figure 1:
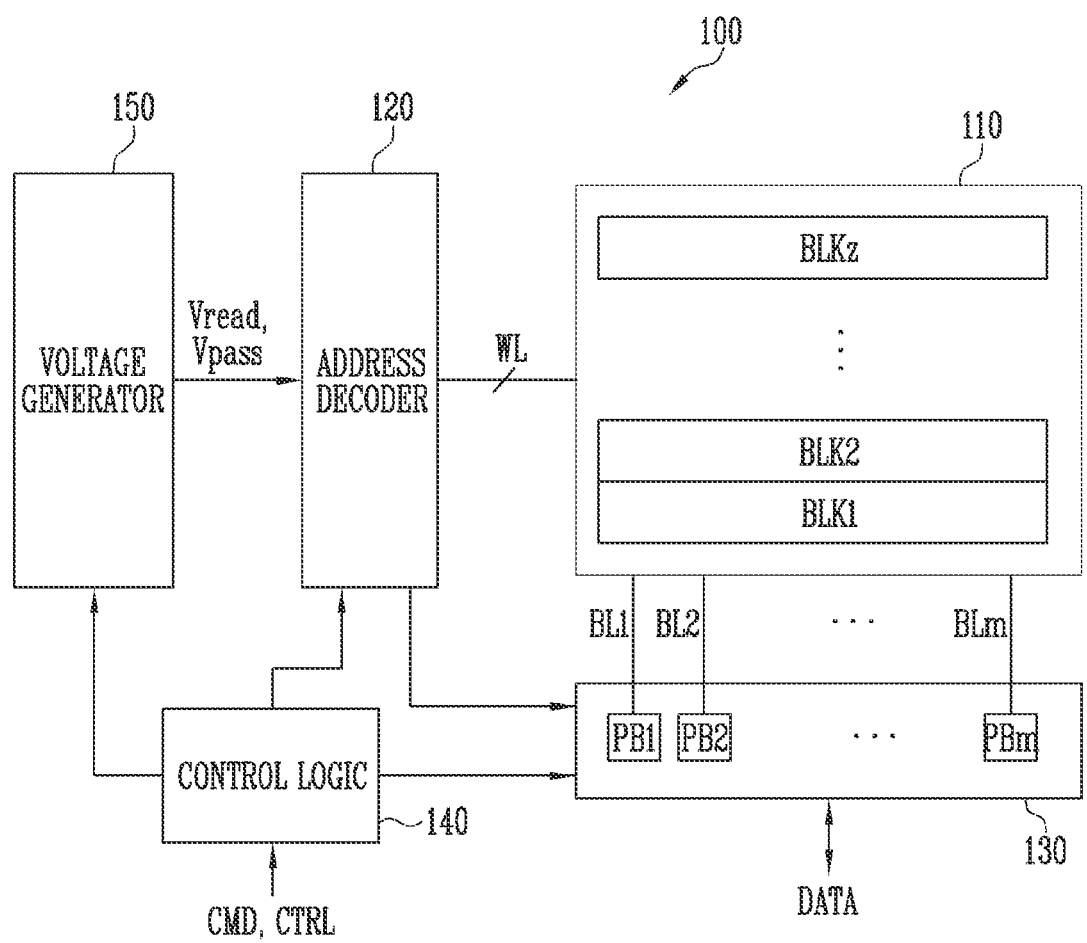
FIG. 1 is a block diagram illustrating a memory device.

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and the descriptions are not limited to the embodiments described in the present specification or application.

An embodiment of the present disclosure provides a memory device capable of reducing a test cost.

In an embodiment, the DDR test controller may output the write enable signal received through the first pad as the internal write enable signal, and output the data strobe signal received through the second pad as the internal data strobe signal, during a normal operation of the memory device.

In an embodiment, the DDR test controller may output the write enable signal received through the first pad as the internal write enable signal in a period in which a command or an address is input during the DDR test operation.

In an embodiment, the DDR test controller may output the write enable signal received through the first pad as the internal data strobe signal in a period in which data is input during the DDR test operation.

In an embodiment, the DDR test controller may include a multiplexer connected to the first pad and the second pad through an input terminal and configured to output the internal data strobe signal according to control of a DDR write enable signal, an inverter configured to invert a signal input to the first pad, and a NAND gate configured to perform a negative AND (NAND) operation on an output of the inverter and an inverted DDR write enable signal to generate the internal write enable signal.

In an embodiment, the DDR test controller may further include a flip-flop, a DDR test enable signal may be input to a data input terminal of the flip-flop, a data input control signal may be input to a dock input terminal of the flip-flop, a column count end signal may be input to a reset input terminal of the flip-flop, and the DDR write enable signal may be output to an output terminal of the flip-flop.

In an embodiment, when the memory device receives a command for the DDR test operation, the DDR test enable signal may be activated to a high state in response to reception of the command.

In an embodiment, when the memory device completes reception of an address signal, the data input control signal may be activated to a high state in response to reception completion of the address signal.

In an embodiment, when the memory device completes reception of data, the column count end signal may be activated to a high state in response to reception completion of the data.

In an embodiment, the DDR write enable signal output to the output terminal of the flip-flop may follow the DDR test enable signal when the data input control signal transits to high.

In an embodiment, the memory device may further include a data path logic circuit configured to receive the internal write enable signal and the internal data strobe signal and transfer the internal write enable signal and the internal data strobe signal to a control logic.

In an embodiment, the DDR test controller may generate the internal write enable signal based on the first signal received through the first pad in a period in which a command or an address is input during the DDR test operation.

In an embodiment, the DDR test controller may generate the internal data strobe signal based on the first signal received through the first pad, in a period in which data is input during the DDR test operation.

In an embodiment, the DDR test controller may include a multiplexer connected to the first pad and the second pad through an input terminal and configured to output the internal data strobe signal under control of a third signal, an inverter configured to invert a signal input to the first pad, and a NAND gate configured to perform a negative AND (NAND) operation on an output of the inverter and an inverted third signal to generate the internal write enable signal.

In an embodiment, the DDR test controller may further include a flip-flop, a fourth signal may be input to a data input terminal of the flip-flop, a fifth signal may be input to a clock input terminal of the flip-flop, a sixth signal may be input to a reset input terminal of the flip-flop, and the third signal may be output to an output terminal of the flip-flop.

In an embodiment, when the memory device receives a command for the DDR test operation, the fourth signal may change to an active state in response to reception of the command.

In an embodiment, when the memory device completes reception of an address signal, the fifth signal may change to an active state in response to reception completion of the address signal.

In an embodiment, when the memory device completes reception of data, the sixth signal may change to an active state in response to reception completion of the data.

In an embodiment, the third signal output to the output terminal of the flip-flop may follow the fourth signal at an edge of the fifth signal.

The present technology may provide a memory device capable of reducing a test cost.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present teachings. In addition, the description and drawings do not necessarily require the order presented. It will be further appreciated that certain actions and/or steps may be described or depicted in a particular order of occurrence while those skilled in the art will understand that such specificity with respect to sequence is not actually required.

As used herein signals having a low level distinguishes from the signal when it has a high level. For example, the high level may correspond to the signal having a first voltage, and the low level may correspond to the signal having a second voltage. For some embodiments, the first voltage is greater than the second voltage. In other embodiments, different characteristics of a signal, such as frequency or amplitude, determine whether the signal has a high level or a low level. For some cases, the high and low levels of a signal represent logical binary states.

For reference, an embodiment including additional components may be provided. Furthermore, an active high or active low configuration indicating an active state of a signal or circuit may be changed depending on embodiments. Furthermore, the configuration of a logic gate or logic gates required for implementing the same function or operation may be modified. That is, the logic gate configuration of one type of operation and another logic gate configuration for the same type of operation may be replaced with each other, depending on a specific situation. If necessary, various logic gates may be applied to implement the configurations.

It will be understood that, although the terms first, second, third etc. may be used herein to describe various elements, components, and/or signals, these elements, components, and/or signals should not be limited by these terms. These terms are only used to distinguish one element, component, or signal from another element, component or signal. Thus, a first element, component, or signal discussed below could be termed a second element, component, or signal without departing from the teachings of the present disclosure.

FIG. 1 is a block diagram illustrating a memory device.

Referring to FIG. 1, the memory device 100 includes a memory cell array 110, an address decoder 120, a read and write circuit 130, control logic 140, and a voltage generator 150. The control logic 140 may be implemented as hardware, software, or a combination of hardware and software. For example, the control logic 140 may be a control logic circuit operating in accordance with an algorithm and/or a processor executing control logic code.

The memory cell array 110 includes a plurality of memory blocks BLK1 to BLKz. The plurality of memory blocks BLK1 to BLKz are connected to the address decoder 120 through word lines WL. The plurality of memory blocks BLK1 to BLKz are connected to the read and write circuit 130 through bit lines BL1 to BLm. Each of the plurality of memory blocks BLK1 to BLKz includes a plurality of memory cells. As an embodiment, the plurality of memory cells are non-volatile memory cells, and may be configured of non-volatile memory cells having a vertical channel structure. The memory cell array 110 may be configured as a memory cell array of a two-dimensional structure. According to an embodiment, the memory cell array 110 may be configured as a memory cell array of a three-dimensional structure. Meanwhile, each of the plurality of memory cells included in the memory cell array may store at least one bit of data. In an embodiment, each of the plurality of memory cells included in the memory cell array 110 may be a single-level cell (SLC) storing one bit of data. In another embodiment, each of the plurality of memory cells included in the memory cell array 110 may be a multi-level cell (MLC) storing two bits of data. In still another embodiment, each of the plurality of memory cells included in the memory cell array 110 may be a triple-level cell (TLC) storing three bits of data. In still another embodiment, each of the plurality of memory cells included in the memory cell array 110 may be a quad-level cell (QLC) storing four bits of data. According to an embodiment, the memory cell array 110 may include a plurality of memory cells each storing five or more bits of data.

The address decoder 120, the read and write circuit 130, the control logic 140, and the voltage generator 150 operate as a peripheral circuit driving the memory cell array 110. The address decoder 120 is connected to the memory cell array 110 through the word lines WL. The address decoder 120 is configured to operate in response to control of the control logic 140. The address decoder 120 receives an address through an input/output buffer (not shown) inside the memory device 100.

The address decoder 120 is configured to decode a block address among received addresses. The address decoder 120 selects at least one memory block according to the decoded block address. In addition, the address decoder 120 applies a read voltage Vread generated in the voltage generator 150 to a selected word line of the selected memory block at a time of a read voltage application operation during a read operation, and applies a pass voltage Vpass to the remaining unselected word lines. In addition, during a program verify operation, the address decoder 120 applies a verify voltage generated in the voltage generator 150 to the selected word line of the selected memory block, and applies the pass voltage Vpass to the remaining unselected word lines.

The address decoder 120 is configured to decode a column address of the received addresses. The address decoder 120 transmits the decoded column address to the read and write circuit 130.

A read operation and a program operation of the memory device 100 are performed in a page unit. Addresses received at a time of a request of the read operation and the program operation include a block address, a row address, and a column address. The address decoder 120 selects one memory block and one word line according to the block address and the row address. The column address is decoded by the address decoder 120 and is provided to the read and write circuit 130.

The address decoder 120 may include a block decoder, a row decoder, a column decoder, an address buffer, and the like.

The read and write circuit 130 includes a plurality of page buffers PB1 to PBm. The read and write circuit 130 may operate as a "read circuit" during a read operation of the memory cell array 110 and may operate as a "write circuit" during a write operation of the memory cell array 110. The plurality of page buffers PB1 to PBm are connected to the memory cell array 110 through the bit lines BL1 to BLm. During the read operation and the program verify operation, in order to sense a threshold voltage of the memory cells, the plurality of page buffers PB1 to PBm senses a change of an amount of a current flowing according to a programmed state of a corresponding memory cell through a sensing node while continuously supplying a sensing current to the bit lines connected to the memory cells, and latches the sensed change as sensing data. The read and write circuit 130 operates in response to page buffer control signals output from the control logic 140.

During the read operation, the read and write circuit 130 senses data of the memory cell, temporarily stores read data, and outputs data DATA to the input/output buffer (not shown) of the memory device 100. As an example of an embodiment, the read and write circuit 130 may include a column selection circuit, and the like, in addition to the page buffers (or page registers).

The control logic 140 is connected to the address decoder 120, the read and write circuit 130, and the voltage generator 150. The control logic 140 receives a command CMD and a control signal CTRL through the input/output buffer (not shown) of the memory device 100. The control logic 140 is configured to control overall operations of the memory device 100 in response to the control signal CTRL. In addition, the control logic 140 outputs a control signal for adjusting a sensing node pre-charge potential level of the plurality of page buffers PB1 to PBm. The control logic 140 may control the read and write circuit 130 to perform the read operation of the memory cell array 110.

The voltage generator 150 generates the read voltage Vread and the pass voltage Vpass during the read operation in response to the control signal output from the control logic 140. In order to generate a plurality of voltages having various voltage levels, the voltage generator 150 may include a plurality of pumping capacitors that receive an internal power voltage, and generate the plurality of voltages by selectively activating the plurality of pumping capacitors in response to the control of the control logic 140.

The address decoder 120, the read and write circuit 130, and the voltage generator 150 may function as a "peripheral circuit" that performs a read operation, a write operation, and an erase operation on the memory cell array 110. The peripheral circuit performs the read operation, the write operation, and the erase operation on the memory cell array 110 based on the control of the control logic 140.

Figure 2:
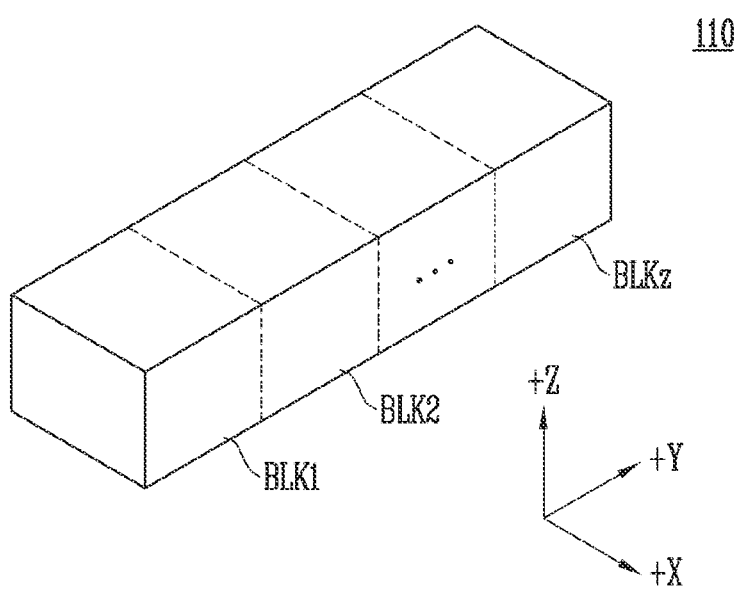
FIG. 2 is a diagram illustrating an embodiment of a memory cell array of FIG. 1.

FIG. 2 is a diagram illustrating an embodiment of the memory cell array of FIG. 1.

Referring to FIG. 2, the memory cell array 110 includes a plurality of memory blocks BLK1 to BLKz. Each memory block may have a three-dimensional structure. Each memory block includes a plurality of memory cells stacked on a substrate. Such plurality of memory cells are arranged along a +X direction, a +Y direction, and a +Z direction. A structure of each memory block is described with reference to FIGS. 4 and 5.

Figure 3:
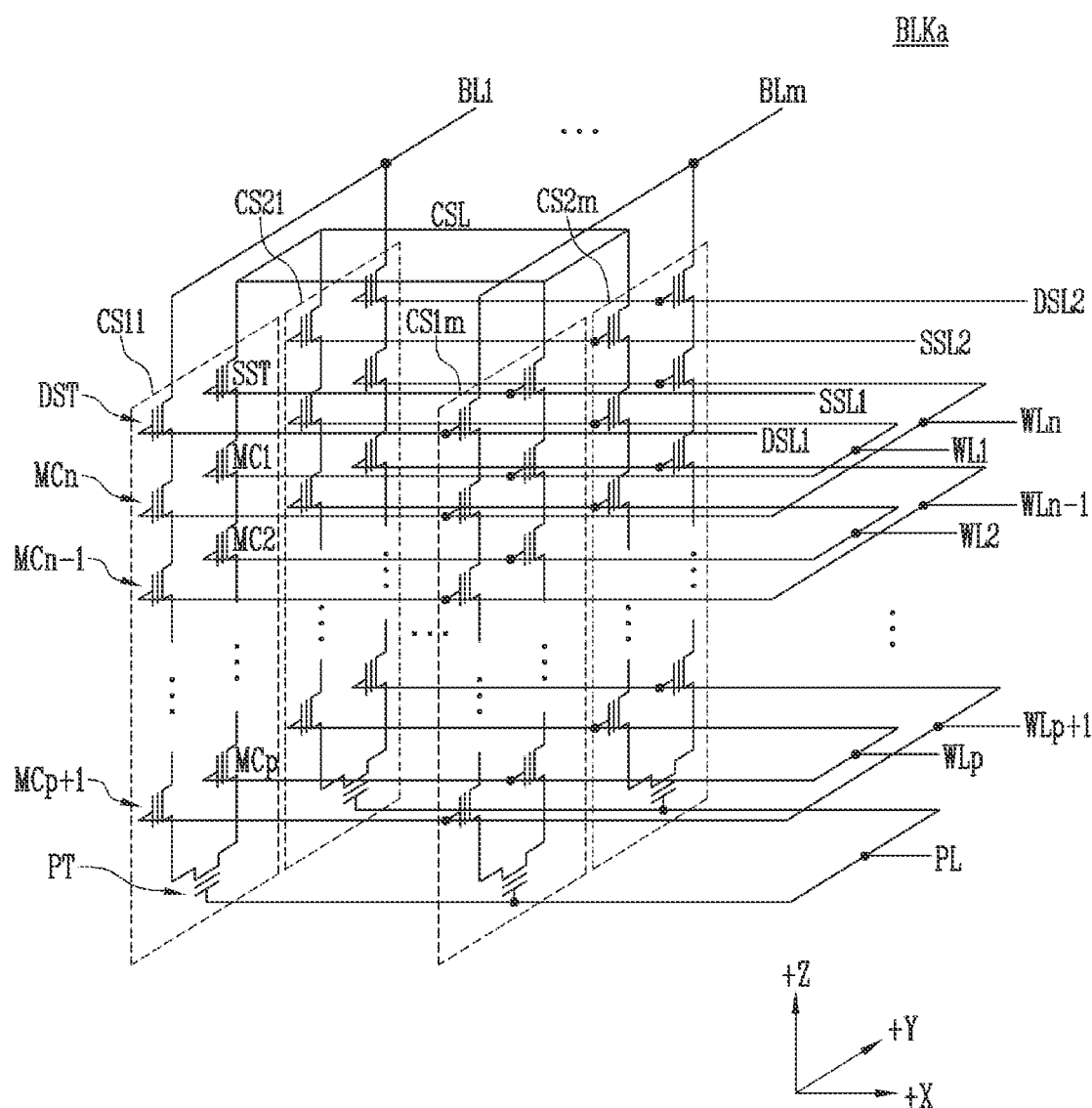
FIG. 3 is a circuit diagram illustrating any one memory block BLKa of memory blocks BLK1 to BLKz of FIG. 2.

FIG. 3 is a circuit diagram illustrating any one memory block BLKa of the memory blocks BLK1 to BLKz of FIG. 2.

Figure 4:
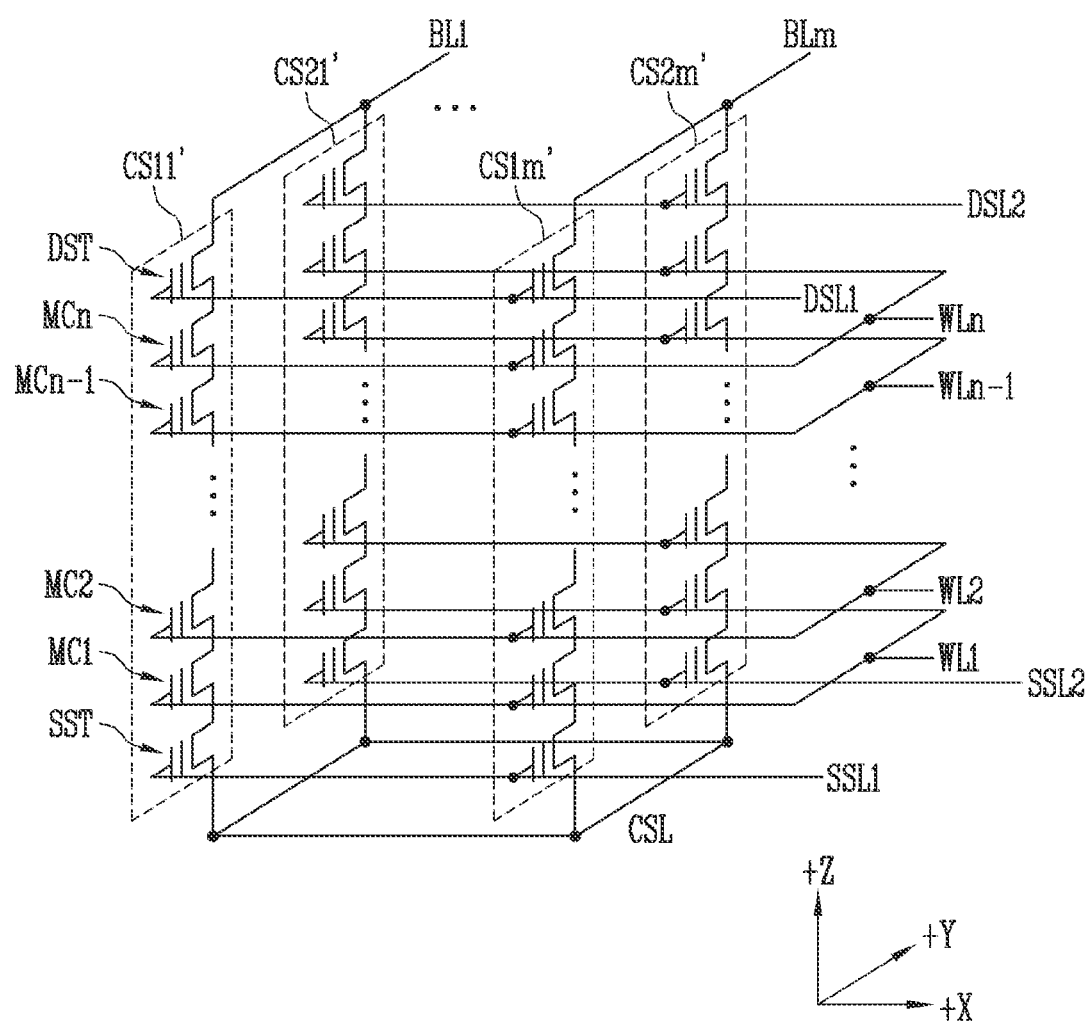
FIG. 4 is a circuit diagram illustrating another embodiment of any one memory block BLKb of the memory blocks BLK1 to BLKz of FIG. 2.

Referring to FIG. 3, the memory block BLKa includes a plurality of cell strings CS11 to CS1m and CS21 to CS2m. As an embodiment, each of the plurality of cell strings CS11 to CS1m and CS21 to CS2m may be formed in a 'U' shape. In the memory block BLKa, m cell strings are arranged in a row direction (that is, the +X direction). In FIG. 4, two cell strings are arranged in a column direction (that is, the +Y direction). However, this is for convenience of description and it may be understood that three or more cell strings may be arranged in the column direction.

Each of the plurality of cell strings CS11 to CS1m and CS21 to CS2m includes at least one source select transistor SST, first to n-th memory cells MC1 to MCn, a pipe transistor PT, and at least one drain select transistor DST.

Each of the select transistors SST and DST and the memory cells MC1 to MCn may have a similar structure. As an embodiment, each of the select transistors SST and DST and the memory cells MC1 to MCn may include a channel layer, a tunneling insulating film, a charge storage film, and a blocking insulating film. As an embodiment, a pillar for providing the channel layer may be provided in each cell string. As an embodiment, a pillar for providing at least one of the channel layer, the tunneling insulating film, the charge storage film, and the blocking insulating film may be provided in each cell string.

The source select transistor SST of each cell string is connected between a common source line CSL and the memory cells MC1 to MCp.

As an embodiment, the source select transistors of the cell strings arranged in the same row are connected to a source select line extending in the row direction, and the source select transistors of the cell strings arranged in different rows are connected to different source select lines. In FIG. 4, the source select transistors of the cell strings CS11 to CS1m of a first row are connected to a first source select line SSL1. The source select transistors of the cell strings CS21 to CS2m of a second row are connected to a second source select line SSL2.

As another embodiment, the source select transistors of the cell strings CS11 to CS1m and CS21 to CS2m may be commonly connected to one source select line.

The first to n-th memory cells MC1 to MCn of each cell string are connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp are sequentially arranged in a direction opposite to the +Z direction, and are connected in series between the source select transistor SST and the pipe transistor PT. The (p+1)-th to n-th memory cells MCp+1 to MCn are sequentially arranged in the +Z direction, and are connected in series between the pipe transistor PT and the drain select transistor DST. The first to p-th memory cells MC1 to MCp and the (p+1)-th to n-th memory cells MCp+1 to MCn are connected to each other through the pipe transistor PT. Gates of the first to n-th memory cells MC1 to MCn of each cell string are connected to the first to n-th word lines WL1 to WLn, respectively.

A gate of the pipe transistor PT of each cell string is connected to a pipeline PL.

The drain select transistor DST of each cell string is connected between a corresponding bit line and the memory cells MCp+1 to MCn. The cell strings arranged in the roar direction are connected to the drain select line extending in the row direction. The drain select transistors of the cell strings CS11 to CS1m of the first row are connected to a first drain select line DSL1. The drain select transistors of the cell strings CS21 to CS2m of the second row are connected to a second drain select line DSL2.

The cell strings arranged in the column direction are connected to the bit lines extending in the column direction. In FIG. 4, the cell strings CS11 and CS21 of the first column are connected to the first bit line BL1. The cell strings CS1m and CS2 of the m-th column are connected to the m-th bit line BLm.

The memory cells connected to the same word line in the cell strings arranged in the row direction configure one page. For example, the memory cells connected to the first word line WL1, among the cell strings CS11 to CS1m of the first row configure one page. The memory cells connected to the first word line WL1, among the cell strings CS21 to CS2m of the second row configure another page. The cell strings arranged in one row direction may be selected by selecting any one of the drain select lines DSL1 and DSL2. One page of the selected cell strings may be selected by selecting any one of the word lines WL1 to WLn.

As another embodiment, even bit lines and odd bit lines may be provided instead of the first to m-th bit lines BL1 to BLm. In addition, even-numbered cell strings among the cell strings CS11 to CS1m or CS21 to SC2m arranged in the row direction may be connected to the even bit lines, and odd-numbered cell strings among the cell strings CS11 to CS1m or CS21 to CS2m arranged in the row direction may be connected to odd bit lines, respectively.

As an embodiment, at least one of the first to n-th memory cells MC1 to MCn may be used as a dummy memory cell. For example, at least one dummy memory cell is provided to reduce an electric field between the source select transistor SST and the memory cells MC1 to MCp. Alternatively, at least one dummy memory cell is provided to reduce an electric field between the drain select transistor DST and the memory cells MCp+1 to MCn. As more dummy memory cells are provided, reliability of an operation for the memory block BLKa is improved, however, the size of the memory block BLKa increases. As less memory cells are provided, the size of the memory block BLKa may be reduced, however, the reliability of the operation for the memory block BLKa may be reduced.

In order to efficiently control at least one dummy memory cell, each of the dummy memory cells may have a required threshold voltage. Before or after an erase operation for the memory block BLKa, program operations for all or a part of the dummy memory cells may be performed. When the erase operation is performed after the program operation is performed, the dummy memory cells may have the required threshold voltage by controlling a voltage applied to dummy word lines connected to the respective dummy memory cells.

FIG. 4 is a circuit diagram illustrating another embodiment of any one memory block BLKb of the memory blocks BLK1 to BLKz of FIG. 2.

Referring to FIG. 4, the memory block BLKb includes a plurality of cell strings CS11' to CS1m' and CS21' to CS2m'. Each of the plurality of cell strings CS11' to CS1m' and CS21' to CS2m' extends along a +Z direction. Each of the plurality of cell strings CS11' to CS1m' and CS21' to CS2m' includes at least one source select transistor SST, first to n-th memory cells MC1 to MCn, and at least one drain select transistor DST stacked on a substrate (not shown) under the memory block BLKb.

The source select transistor SST of each cell string is connected between a common source line CSL and memory cells MC1 to MCn. The source select transistors of the cell strings arranged in the same row are connected to the same source select line. The source select transistors of the cell strings CS11' to CS1m' arranged in a first row are connected to a first source select line SSL1. The source select transistors of the cell strings CS21' to CS2m' arranged in a second row are connected to a second source select line SSL2. As another embodiment, the source select transistors of the cell strings CS11' to CS1m' and CS21' to CS2m' may be commonly connected to one source select line.

The first to n-th memory cells MC1 to MCn of each cell string are connected in series between the source select transistor SST and the drain select transistor DST. Gates of the first to n-th memory cells MC1 to MCn are connected to first to the n-th word lines WL1 to WLn, respectively.

The drain select transistor DST of each cell string is connected between a corresponding bit line and the memory cells MC1 to MCn. The drain select transistors of the cell strings arranged in the row direction are connected to a drain select line extending in the row direction. The drain select transistors of the cell strings CS11' to CS1m' of a first row are connected to a first drain select line DSL1. The drain select transistors of the cell strings CS21' to CS2m' of a second row are connected to a second drain select line DSL2.

As a result, the memory block BLKb of FIG. 4 has an equivalent circuit similar to the memory block BLKa of FIG. 3 except that the pipe transistor PT is excluded from each cell string.

As another embodiment, even bit lines and odd bit lines may be provided instead of the first to m-th bit lines BL1 to BLm. In addition, even-numbered cell strings among the cell strings CS11' to CS1m' or CS21' to CS2m' arranged in the row direction may be connected to even bit lines, and odd-numbered cell strings among the cell strings CS11' to CS1m' or CS21' to CS2m' arranged in the row direction may be connected to odd bit lines, respectively.

As an embodiment, at least one of the first to n-th memory cells MC1 to MCn may be used as a dummy memory cell. For example, at least one dummy memory cell is provided to reduce an electric field between the source select transistor SST and the memory cells MC1 to MCn. Alternatively, at least one dummy memory cell is provided to reduce an electric field between the drain select transistor DST and the memory cells MC1 to MCn. As more dummy memory cells are provided, reliability of an operation for the memory block BLKb is improved, however, the size of the memory block BLKb increases. As less memory cells are provided, the size of the memory block BLKb may be reduced, however, the reliability of the operation for the memory block BLKb may be reduced.

In order to efficiently control at least one dummy memory cell, each of the dummy memory cells may have a required threshold voltage. Before or after an erase operation for the memory block BLKb, program operations for all or a part of the dummy memory cells may be performed. When the erase operation is performed after the program operation is performed, the dummy memory cells may have the required threshold voltage by controlling a voltage applied to the dummy word lines connected to the respective dummy memory cells.

Figure 5:
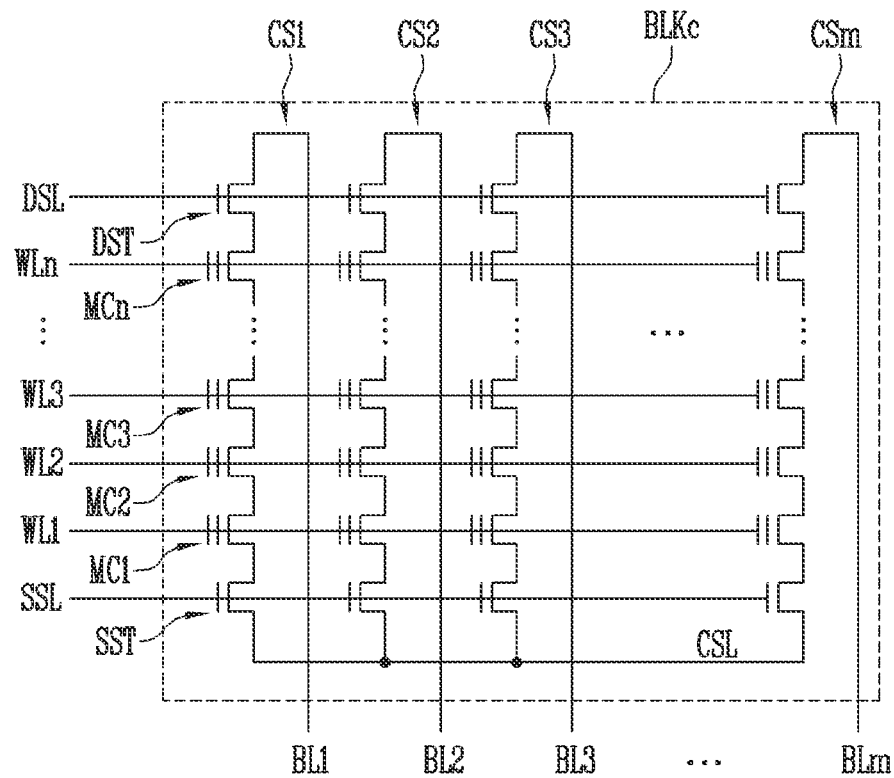
FIG. 5 is a circuit diagram illustrating an embodiment of any one memory block BLKc of the memory blocks BLK1 to BLKz included in the memory cell array 110 of FIG. 1.

FIG. 5 is a circuit diagram illustrating an embodiment of any one memory block BLKc of the memory blocks BLK1 to BLKz included in the memory cell array 110 of FIG. 1.

Referring to FIG. 5, the memory block BKLc includes a plurality of cell strings CS1 to CSm. The plurality of cell strings CS1 to CSm may be connected to a plurality of bit lines BL1 to BLm, respectively. Each of the cell strings CS1 to CSm includes at least one source select transistor SST, first to n-th memory cells MC1 to MCn, and at least one drain select transistor DST.

Each of the select transistors SST and DST and the memory cells MC1 to MCn may have a similar structure. As an embodiment, each of the select transistors SST and DST and the memory cells MC1 to MCn may include a channel layer, a tunneling insulating film, a charge storage film, and a blocking insulating film. As an embodiment, a pillar for providing the channel layer may be provided in each cell string. As an embodiment, a pillar for providing at least one of the channel layer, the tunneling insulating film, the charge storage film, and the blocking insulating film may be provided in each cell string.

The source select transistor SST of each cell string is connected between a common source line CSL and the memory cells MC1 to MCn.

The first to n-th memory cells MC1 to MCn of each cell string are connected between the source select transistor SST and the drain select transistor DST.

The drain select transistor DST of each cell string is connected between a corresponding bit line and the memory cells MC1 to MCn.

Memory cells connected to the same word line configure one page. The cell strings CS1 to CSm may be selected by selecting the drain select line DSL. One page among the selected cell strings may be selected by selecting any one of the word lines WL1 to WLn.

As another embodiment, even bit lines and odd bit lines may be provided instead of the first to m-th bit lines BL1 to BLm. Even-numbered cell strings among the cell strings CS1 to CSm may be connected to even bit lines, and odd-numbered cell strings may be connected to odd bit lines, respectively.

As shown in FIGS. 2 to 4, the memory cell array 110 of the memory device 100 may be configured as a memory cell array of a three-dimensional structure. In addition, as shown in FIG. 5, the memory cell array 110 of the memory device 100 may be configured as a memory cell array of a two-dimensional structure.

Figure 6:
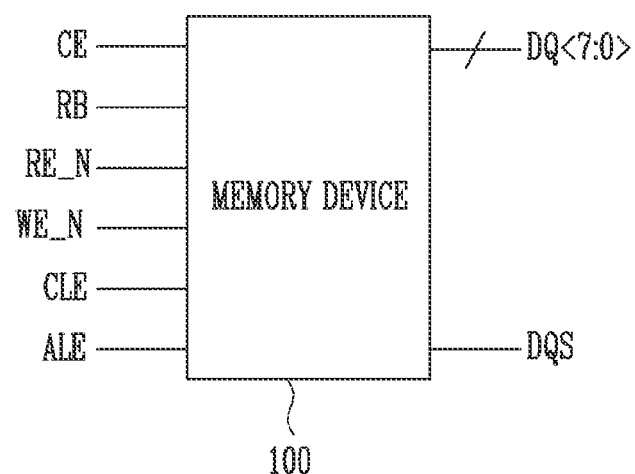
FIG. 6 is a diagram for describing a pin configuration of the memory device.

FIG. 6 is a diagram for describing a pin configuration of the memory device. Referring to FIG. 6, the memory device 100 communicates with an external memory controller through a plurality of lines.

The memory device 100 communicates with the memory controller through a chip enable (CE) line, a command latch enable (CLE) line, an address latch enable (ALE) line, a write enable (WE_N) line, a read enable (RE_N) line, and a ready busy (RB) line, a data input/output (DQ<7:0>) line, and a data strobe (DQS) line.

The chip enable (CE) line transfers a chip enable (CE) signal, which is a signal indicating that a corresponding memory device 100, that is, a memory chip is operable. The chip enable (CE) signal may be selectively applied to memory chips connected to the same channel. When the chip enable (CE) signal decreases to low, the chip enable (CE) signal indicates that all operations in a corresponding memory chip are possible. When the chip enable (CE) signal is high, the chip enable (CE) signal indicates that the corresponding memory chip is in a standby state.

While the operation is performed inside the memory chip, a ready busy (RB) signal transferred to the ready busy (RB) line has a low state. When the ready busy (RB) signal has the low state, the memory chip does not exchange other signals with the outside. When the ready busy (RB) signal is high, this indicates that the memory chip is in a ready state. When the memory chip is in the ready state, the memory chip may exchange a signal with the outside.

While a command CMD is input to the memory device 100, a command latch enable (CLE) signal becomes high. An address latch enable (ALE) signal becomes high while an address is input to a memory device.

The command CMD and address are input to a selected memory chip when a write enable (WE_N) signal transits from low to high, that is, at a rising edge of the write enable (WE_N) signal. In another embodiment, the command CMD and the address ADD may be input to the selected memory chip, when the write enable (WE_N) signal transits from high to low, that is, a falling edge of the write enable (WE_N) signal.

The write enable (WE_N) signal is toggled when loading the command and the address on the memory chip, and the read enable (RE_N) signal is toggled when loading data on the memory controller.

The data input/output (DQ<7:0>, that is, DQ<0> to DQ<7>) lines input the command, the address, and data to the memory device 100, or output data from the memory device 100 to the memory controller. Since the data is configured of 8 bits, the data input/output (DQ<7:0>) lines are also eight. However, the number of data input/output lines is not limited to eight, and may be expanded to 16 or 32 in various embodiments.

The data strobe (DQS) signal is a signal for synchronization when data is input/output through the data input/output (DQ<7:0>) line. For example, in a double data rate (DDR) mode, a data signal may be input to the memory device 100 or may be output from the memory device 100 through the data input/output (DQ<7:0>) line at a rising edge and a falling edge of the data strobe (DQS) signal. In an embodiment, the data strobe (DQS) signal may be input and output to and from the memory device 100 through the data strobe (DQS) line.

Figure 7:
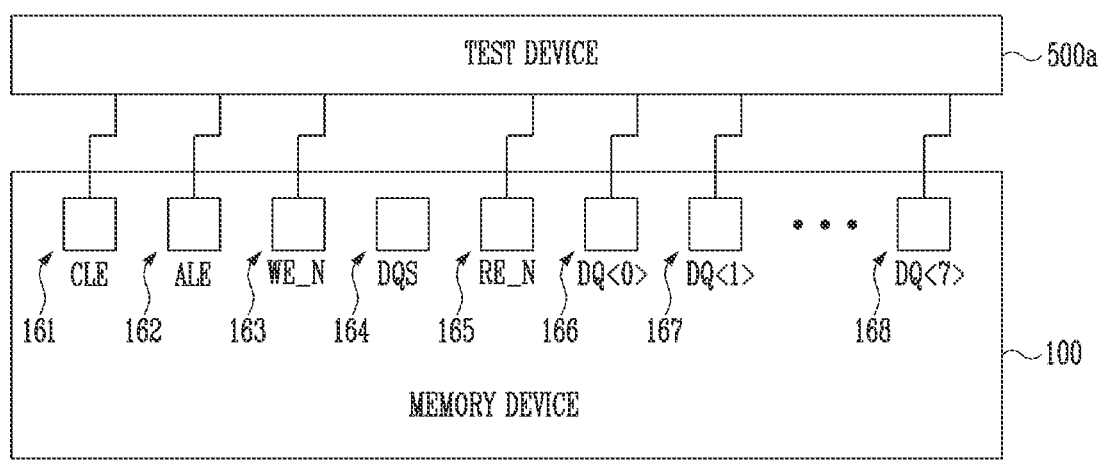
FIG. 7 is a diagram for describing a single data rate (SDR) test of the memory device.

FIG. 7 is a diagram for describing a single data rate (SDR) test of the memory device. Referring to FIG. 7, the command latch enable (CLE) signal, the address latch enable (ALE) signal, the write enable (WE_N) signal, the data strobe (DQS) signal, and the read enable (RE_N) signal may be input through pads 161, 162, 163, 164, and 165, respectively. In addition, data may be input/output through pads 166, 167, . . . , and 168. In FIG. 7, illustration of a pad for inputting the chip enable (CE) signal and the ready busy (RB) signal is omitted.

When performing the SDR test of the memory device 100, a probe card of a test device 500a may be connected to the pads 161 to 163 and 165 to 168 included in the memory device 100. In particular, the data strobe (DQS) signal might not be used in the SDR test of the memory device 100. Therefore, as shown in FIG. 7, when performing the SDR test of the memory device 100, the probe card of the test device 500a might not be connected to the pad 164.

Figure 8:
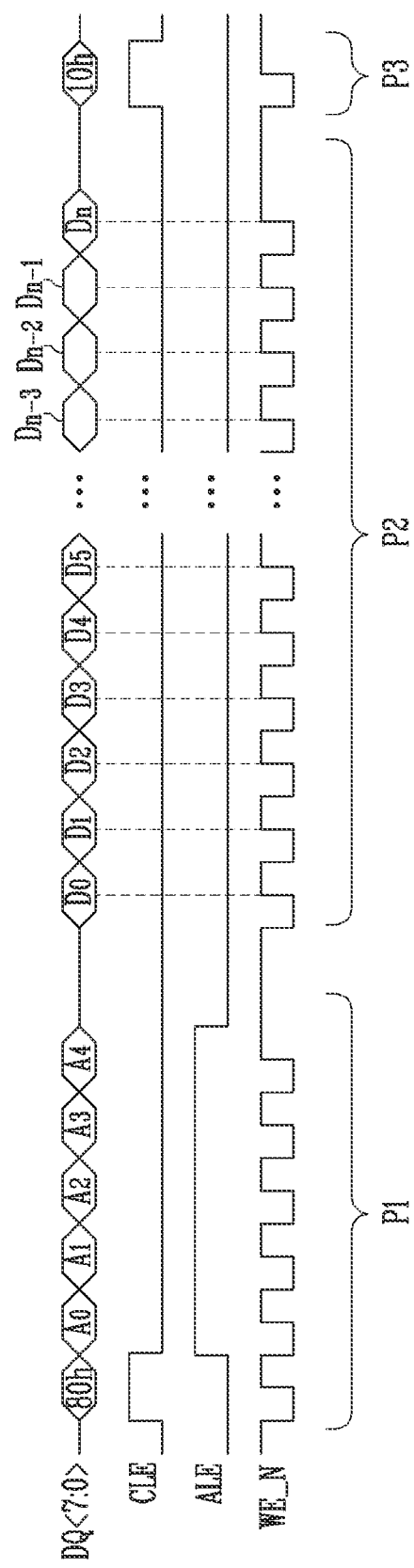
FIG. 8 is a timing diagram for describing the SDR test of the memory device.

FIG. 8 is a timing diagram for describing the SDR test of the memory device. Referring to FIG. 8, a signal of the data input/output (DQ<7:0>) line, the command latch enable (CLE) signal, the address latch enable (ALE) signal, and the write enable (WE_N) signal during the SDR test of the memory device 100 are shown.

In step 1 (P1), in a state in which the command latch enable (CLE) signal is activated to high, a "80h" signal may be input through the data input/output (DQ<7:0>) line. The "80h" signal is a part of a program command, and may be a signal indicating a start of the program operation. After the "80h" signal is input, the command latch enable (CLE) signal may be deactivated to low, and the address latch enable (ALE) signal may be activated to high. In a state in which the address latch enable (ALE) signal is activated, address signals $A_0$ to $A_4$ may be input through the data input/output (DQ<7:0>) line. After the address signals $A_5$ to $A_4$ are input, the address latch enable (ALE) signal may be deactivated to low. In step 1 (P1), the "80h" signal and the address signals $A_0$ to $A_4$ that are part of the program command may be input in synchronization with the write enable (WE_N) signal. In the example of FIG. 7, the "80h" signal and the address signals $A_0$ to $A_4$ that are part of the program command may be input to the memory device at the rising edge of the write enable (WE_N) signal.

In step 2 (P2), data signals $D_0$ to $D_n$ may be input to the memory device through the data input/output (DQ<7:0>) line. In a case of the SDR test, similarly to the command and the address, the data signals $D_0$ to $D_n$ may be input to the memory device at the rising edge of the write enable signal WE_N.

In step 3 (P3) after the data input is completed, a "10h" signal may be input through the data input/output (DQ<7:0>) line in a state in which the command latch enable (CLE) signal is activated to high. The "10h" signal may be a signal indicating that a data signal to be programmed is input to the memory device. Although not shown in FIG. 8, data input after step 3 (P3) may be programmed in memory cells of a selected page in the memory device.

As shown in FIG. 8, in an SDR mode of the memory device, the command, the address, and the data signals may be input in synchronization with the write enable (WE_N) signal. Therefore, in this case, a data strobe (DQS) pad of the memory device is not used.

Figure 9:
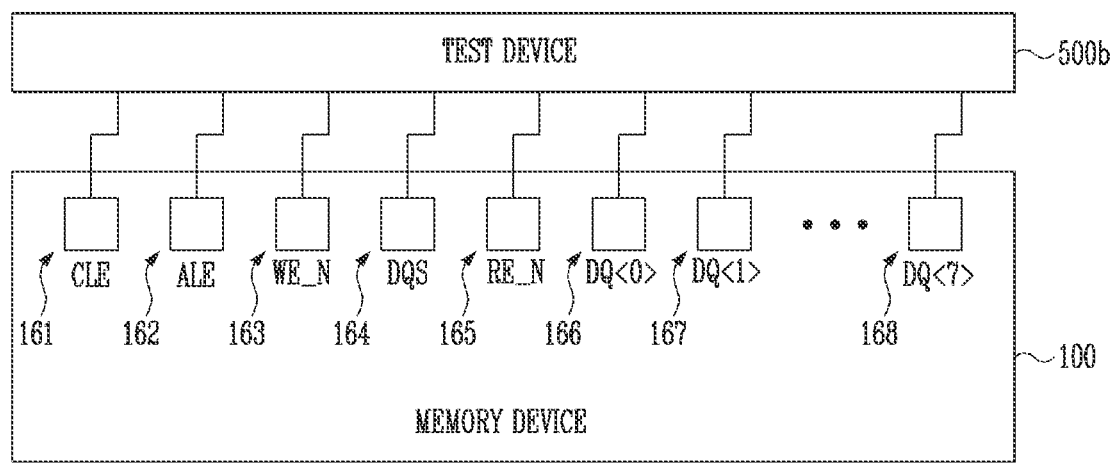
FIG. 9 is a diagram for describing a double data rate (DDR) test of the memory device.

FIG. 9 is a diagram for describing a double data rate (DDR) test of the memory device. Referring to FIG. 9, the command latch enable (CLE) signal, the address latch enable (ALE) signal, the write enable (WE_N) signal, the data strobe (DQS) signal, and the read enable (RE_N) signal may be input through the pads 161, 162, 163, 164, and 165, respectively. In addition, data may be input and output through the pads 166, 167, and 168.

When performing the DDR test of the memory device 100, a probe card of a test device 500b may be connected to the pads 161 to 168 included in the memory device 100. In particular, in the DDR test of the memory device 100, differently from the SDR test, the data strobe (DQS) signal may be used. Therefore, as shown in FIG. 7, when performing the DDR test of the memory device 100, the probe card of the test device 500b is required to be connected to the pad 164.

Figure 10:
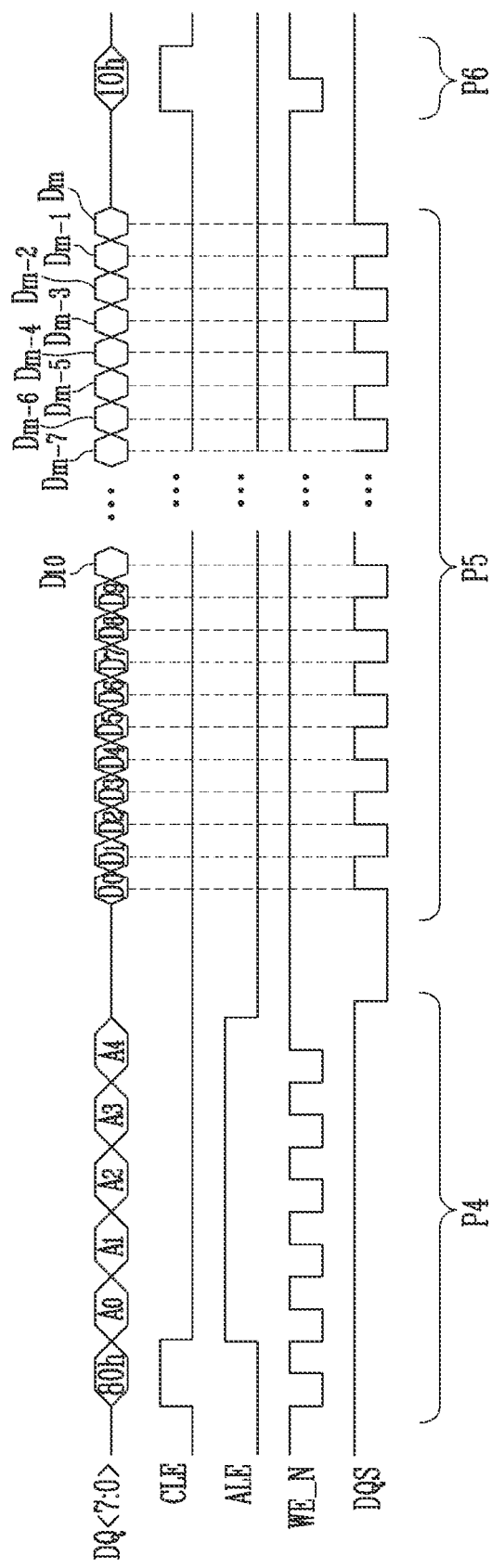
FIG. 10 is a timing diagram or describing the DDR test of the memory device.

FIG. 10 is a timing diagram for describing the DDR test of the memory device. Referring to FIG. 10, the signal of the data input/output (DQ<7:0>) line, the command latch enable (CLE) signal, the address latch enable (ALE) signal, the write enable (WE_N) signal, and the data strobe (DQS) signal during the DDR test of the memory device 100 are shown.

In step 4 (P4), in a state in which the command latch enable (CLE) signal is activated to high, a "80h" signal may be input through the data input/output (DQ<7:0>) line. The "80h" signal is a part of a program command, and may be a signal indicating a start of the program operation. After the "80h" signal is input, the command latch enable (CLE) signal may be deactivated to low, and the address latch enable (ALE) signal may be activated to high. In a state in which the address latch enable (ALE) signal is activated, address signals $A_0$ to $A_4$ may be input through the data input/output (DQ<7:0>) line. After the address signals $A_0$ to $A_4$ are input, the address latch enable (ALE) signal may be deactivated to low. During step 4 (P4), the data strobe (DQS) signal may maintain a high state. Step 4 (P4) shown in FIG. 10 may be substantially the same as step 1 (P1) shown in FIG. 8.

In step 5 (P5), data signals $D_0$ to $D_m$ may be input to the memory device through the data input/output (DQ<7:0>) line. Apart from the SDR test, in the DDR test, the data signals $D_0$ to $D_m$ may be input to the memory device at a rising edge and a falling edge of the data strobe (DQS) signal. Meanwhile, during step 5 (P5), the write enable (WE_N) signal may maintain a high state.

In step 6 (P6) after the data input is completed, a "10h" signal may be input through the data input/output (DQ<7:0>) line in a state in which the command latch enable (CLE) signal is activated to high. The "10h" signal may be a signal indicating that a data signal to be programmed is input to the memory device. Although not shown in FIG. 10, data input after step 6 (P6) may be programmed in memory cells of a selected page in the memory device. Step 6 (P6) shown in FIG. 10 may be substantially the same as step 3 (P3) shown in FIG. 8.

As shown in FIG. 10, in a DDR mode of the memory device, the command and address signals may be input in synchronization with the write enable (WE_N) signal. Meanwhile, in the DDR mode of the memory device, a data signal may be input in synchronization with the data strobe (DQS) signal. Therefore, in this case, a data strobe (DQS) pad of the memory device is required to be used.

Referring to FIGS. 7 and 8, the probe card of the test device 500a that performs the SDR test of the memory device 100 is not required to be connected to the data strobe (DQS) pad. Therefore, the probe card of the test device 500a may omit a component for connection with the data strobe (DQS) pad. In this case, a manufacturing cost of the test device 500a may be reduced.

However, referring to FIGS. 9 and 10, the probe card of the test device 500b that performs the DDR test of the memory device 100 is required to be connected to the data strobe (DQS) pad. Compared to the test device 500a shown in FIG. 7, the probe card of the test device 500b shown in FIG. 9 is required to include a component for connection with the data strobe (DQS) pad. Therefore, a manufacturing cost of the test device 500b capable of performing the DDR test increases.

The memory device according to an embodiment of the present disclosure includes a DDR test controller that generates an internal write enable (WE_N_INT) signal and an internal data strobe DQS_INT. The DDR test controller outputs the data strobe (DQS) signal input through the pad during a normal operation as the internal data strobe DQS_INT. In addition, the DDR test controller outputs the write enable (WE_N) signal input through the pad during the normal operation as the internal write enable signal WE_N_INT.

Meanwhile, during the DDR test operation, the DDR test controller outputs the write enable (WE_N) signal input through the pad in at least a portion of the test operation as an internal data strobe DQS_INT. Therefore, the DDR test of the memory device 100 may be performed without using a pad to which the data strobe (DQS) signal is input.

Referring to FIG. 10 again, in the DDR test operation of the memory device 100, in a period 4 (P4) in which the "80h" command and the address are input and in a period 6 (P6) in which the "10h" command is input, the data strobe (DQS) signal maintains a high state and the write enable (WE_N) signal toggles. Meanwhile, in a period 5 (P5) in which data is input, the write enable (WE_N) signal maintains a high state and the data strobe (DQS) signal toggles. That is, in the DDR test operation of the memory device 100, there is no period in which the data strobe (DQS) signal and the write enable (WE_N) signal simultaneously toggle.

Using this point, through the pad 163 from the test device 500a, in the period 4 (P4) in which the "80h" command and the address are input and the period 6 (P6) in which the "10h" command indicating a program end is input, a signal serving as a write enable (WE_N) signal may be input. In addition, through the pad 163 from the test device 500a, in the period 5 (P5) in which data is input, a signal serving as the data strobe (DQS) signal is input. The memory device 100 according to the present disclosure may use the signal input through the pad 163 during the period 4 (P4) and the period 6 (P6) as the write enable (WE_N) signal, and use the signal input through the pad 163 during the period 5 (P5) may be used as the data strobe (DQS) signal. Therefore, the DDR test may be performed in a state in which the probe card of the test device 500a is not connected to the pad 164.

That is, the DDR test of the memory device 100 may be performed using the test device 500a shown in FIG. 7. Accordingly, a manufacturing cost of a test device capable of performing the DDR test as well as the SDR test of the memory device 100 may be reduced. As a result, a test cost of the memory device 100 may be reduced.

Figure 11:
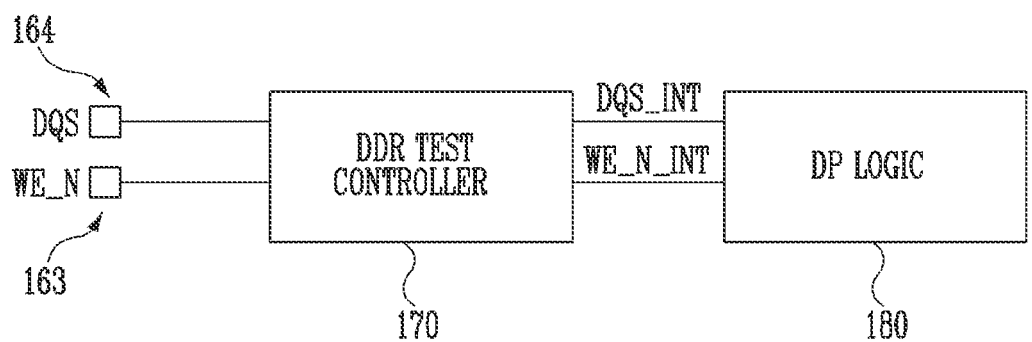
FIG. 11 is a block diagram illustrating the memory device according to an embodiment of the present disclosure.

FIG. 11 is a block diagram illustrating the memory device according to an embodiment of the present disclosure.

Referring to FIG. 11, the memory device according to an embodiment of the present disclosure includes a DDR test controller 170 and a data path logic circuit (DP LOGIC) 180. The DDR test controller 170 may be connected to the pads 163 and 164. Meanwhile, the DDR test controller 170 may be connected to the data path logic circuit 180.

The data path logic circuit 180 may be a circuit that transfers the received internal data strobe (DQS_INT) signal and internal write enable (WE_N_INT) signal to a core area inside the memory device 100, for example, the control logic 140 shown in FIG. 1. Although not shown in FIG. 11, the data path logic circuit 180 may be directly or indirectly connected to the pads 161, 162, 165, 166, 167, . . . , and 168 shown in FIGS. 7 and 9, and receive the command latch enable (CLE) signal, the address latch enable (ALE) signal, the read enable (RE_N) signal, and the data signal. The data path logic circuit 180 may transfer the command latch enable (CLE) signal, the address latch enable (ALE) signal, and the read enable (RE_N) signal to the control logic 140 shown in FIG. 1. In addition, the data path logic circuit 180 may transfer the data signal received through the data input/output (DQ<7:0>) line to the read and write circuit 130 shown in FIG. 1.

In the normal operation of the memory device 100, the DDR test controller 170 transfers the signal received by the pad 164 to the data path logic circuit 180 as the internal data strobe (DQS_INT) signal. Meanwhile, in the normal operation of the memory device 100, the DDR test controller 170 transfers the signal received by the pad 163 to the data path logic circuit 180 as the internal write enable (WE_N_INT) signal. The internal write enable (WE_N_INT) signal may be transferred to the control logic 140.

In the SDR test operation of the memory device 100, the DDR test controller 170 transfers the signal received by the pad 163 to the data path logic circuit 180 as the internal write enable (WE_N_INT) signal. In this case, the internal data strobe (DQS_INT) signal is not required to be generated. Meanwhile, in the SDR test operation of the memory device 100, the pad 164 is not used.

In the DDR test operation of the memory device 100, the pad 164 is not used. During the DDR test operation of the memory device 100, in a period in which the program command and the addresses are input, the DDR test controller 170 transfers the signal input to the pad 163 to the data path logic circuit 180 as the internal write enable (WE_N_INT) signal. Meanwhile, during the DDR test operation, in the period in which the program command and the addresses are input, the DDR test controller 170 generates the internal data strobe (DQS_INT) signal of a high state and transfers the internal data strobe (DQS_INT) signal to the data path logic circuit 180.

Meanwhile, during the DDR test operation, in a period in which data is input, the DDR test controller 170 transfers the signal input to the pad 163 to the data path logic circuit 180 as the internal data strobe (DQS_INT) signal. Meanwhile, during the DDR test operation, in the period in which data is input, the DDR test controller 170 generates the internal write enable (WE_N_INT) signal of the high state and transfers the internal write enable (WE_N_INT) signal to the data path logic circuit 180. Hereinafter, more description is given with reference to FIG. 12.

Figure 12:
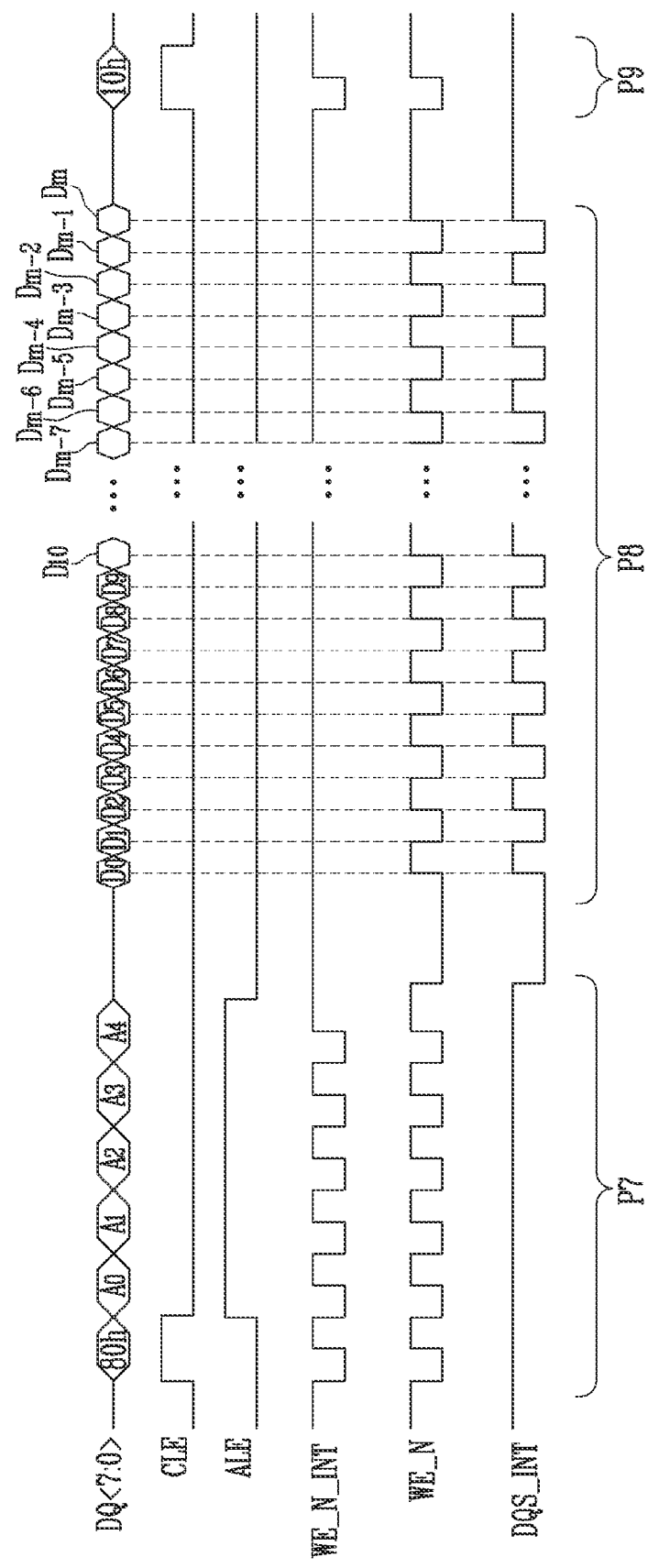
FIG. 12 is a timing diagram for describing the DDR test of the memory device shown in FIG. 11.

FIG. 12 is a timing diagram for describing the DDR test of the memory device shown in FIG. 11.

Referring to FIG. 12, the signal of the data input/output (DQ<7:0>) line, the command latch enable (CLE) signal, the address latch enable (ALE) signal, the internal write enable (WE_N_INT) signal, the write enable (WE_N) signal, and the internal data strobe (DQS_INT) signal during the DDR test operation of the memory device 100 are shown, Since the memory device 100 does not receive the data strobe (DQS) signal from the outside during the DDR test operation, a timing diagram of the data strobe (DQS) signal is omitted in FIG. 12.

In a period 7 (P7), in a state in which the command latch enable (CLE) signal is activated to high, the "80h" signal may be input through the data input/output (DQ<7:0>) line. After the "80h" signal is input, the command latch enable (CLE) signal is deactivated to low, and the address latch enable (ALE) signal may be activated to high. In a state in which the address latch enable (ALE) signal is activated, address signals A0 to A4 may be input through the data input/output (DQ<7:0>) line.

In the period 7 (P7), the DDR test controller 170 may transfer the write enable (WE_N) signal transferred through the pad 163 to the data path logic circuit 180 as the internal write enable (WE_N_INT) signal. Therefore, in the period 7 (P7), the internal write enable signal WE_N_INT may toggle identically to the write enable (WE_N) signal. In the period 7 (P7), the "80h" signal and the address signals A0 to A4, which are part of the program command, may be input in synchronization with the internal write enable signal WE_N_INT. In the example of FIG. 12, the "80h" signal and the address signals A0 to A4 that are part of the program command may be input to the memory device at a rising edge of the internal write enable signal WE_N_INT. Meanwhile, in the period 7 (P7), the DDR test controller 170 may generate an internal data strobe (DQS_INT) signal of a high state and transfer the internal data strobe (DQS_INT) signal to the data path logic circuit 180.

In a period 8 (P8), data signals D0 to Dm may be input to the memory device through the data input/output (DQ<7:0>) line. In the period 8 (P8), the DDR test controller 170 may transfer the write enable (WE_INT) signal transferred through the pad 163 to the data path logic circuit 180 as the internal data strobe (DQS_INT) signal. Accordingly, in the period 8 (P8), the internal data strobe (DQS_INT) signal may toggle identically to the write enable (WE_N) signal. The data signals D0 to Dm may be input to the memory device at a rising edge and a falling edge of the internal data strobe (DQS_INT) signal.

Meanwhile, in the period 8 (P8), the DDR test controller 170 may generate the internal write enable (WE_N_INT) signal of a high state and transfer the internal write enable (WE_N_INT) signal to the data path logic circuit 180.

In a period 9 (P9) after the data input is completed, a "10h" signal may be input through the data input/output (DQ<7:0>) line in a state in which the command latch enable (CLE) signal is activated to high. Substantially the same as in the period 7 (P7), in the period 9 (P9), the DDR test controller 170 may transfer the write enable (WE_N) signal transferred through the pad 163 to the data path logic circuit 180 as the internal write enable (WE_N_INT) signal. Therefore, in the period 9 (P9), the internal write enable (WE_N_INT) signal may toggle identically to the write enable (WE_N) signal. In the period 9 (P9), the "10h" signal may be input in synchronization with the internal write enable signal WE_N_INT.

Substantially the same as in the period 7 (P7), in the period 9 (P9), the DDR test controller 170 may generate the internal data strobe (DQS_INT) signal of a high state and transfer the internal data strobe (DQS_INT) signal to the data path logic circuit 180.

According to an embodiment of the present disclosure, the command and the address may be input to the memory device 100 in synchronization with the internal write enable (WE_N_INT) signal. The DDR test controller 170 of the memory device 100 may transfer the write enable (WE_N) signal received by the pad 163 to the data path logic circuit 180 as the internal write enable (WE_N_INT) signal in a period in which the command and the address are input during the DDR test. In this case, the DDR test controller 170 may generate the internal data strobe (DQS_INT) signal of a high state and transfer the internal data strobe (DQS_INT) signal to the data path logic circuit 180.

Meanwhile, according to an embodiment of the present disclosure, data may be input to the memory device 100 in synchronization with the internal data strobe (DQS_INT) signal. The DDR test controller 170 of the memory device 100 may transfer the write enable (WE_N) signal received by the pad 163 to the data path logic circuit 180 as the internal data strobe (DQS_INT) signal in a period in which data is input during the DDR test. In this case, the DDR test controller 170 may generate the internal write enable (WE_N_INT) signal of a high state and transfer the internal write enable (WE_N_INT) signal to the data path logic circuit 180.

Therefore, according to an embodiment of the present disclosure, the DDR test of the memory device 100 may be performed without using the pad 164 to which the data strobe (DQS) signal is input. Accordingly, the manufacturing cost of the test device capable of performing the DDR test as well as the SDR test of the memory device 100 may be reduced. As a result, the test cost of the memory device 100 may be reduced.

Figure 13:
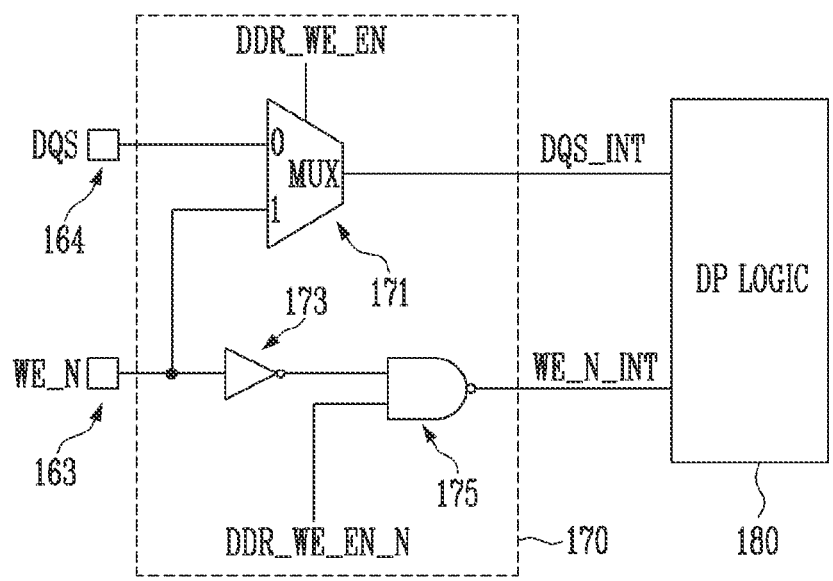
FIG. 13 is a block diagram illustrating an example of an embodiment of a DDR test controller shown in FIG. 11.

FIG. 13 is a block diagram illustrating an example of an embodiment of the DDR test controller shown in FIG. 11.

Referring to FIG. 13, the DDR test controller 170 includes a multiplexer 171, an inverter 173, and a NAND gate 175. A first input terminal of the multiplexer 171 is connected to the pad 164. A second input terminal of the multiplexer 171 is connected to the pad 163. The multiplexer 171 is controlled by a DDR write enable (DDR_WE_EN) signal. When the DDR write enable (DDR_WE_EN) signal is high, the multiplexer 171 may transfer the write enable (WE_N) signal received from the pad 163 to the data path logic circuit 180 as the internal data strobe DQS_INT. When the DDR write enable (DDR_WE_EN) signal is low, the multiplexer 171 may transfer the data strobe (DQS) signal received from the pad 164 to the data path logic circuit 180 as the internal data strobe DQS_INT.

The inverter 173 inverts the write enable (WE_N) signal and transfers an inverted write enable signal to the first input terminal of the NAND gate 175. Meanwhile, an inverted DDR write enable (DDR_WE_EN_N) signal is input to a second input terminal of the NAND gate 175. The NAND gate 175 generates the internal write enable (WE_N_INT) signal by performing a not AND (NAND) operation on signals of the first input terminal and the second input terminal.

When the DDR write enable (DDR_WE_EN) signal is high, the inverted DDR write enable (DDR_WE_EN_N) signal may be low. In this case, regardless of the write enable (WE_N) signal, the NAND gate 175 may generate the internal write enable (WE_N_INT) signal of a high state and transfer the internal write enable (WE_N_INT) signal to the data path logic circuit 180.

When the DDR write enable (DDR_WE_EN) is low, the inverted the DDR write enable (DDR_WE_EN_N) signal may be high. In this case, the NAND gate 175 may invert a signal received by the first input terminal to generate the internal write enable (WE_N_INT) signal and transfer the internal write enable (WE_N_INT) signal to the data path logic circuit 180. That is, the write enable (WE_N) signal may be transferred to the data path logic circuit 180 as the internal write enable (WE_N_INT) signal.

According to an embodiment of the present disclosure, the command and the address may be input to the memory device 100 in synchronization with the internal write enable (WE_N_INT) signal. The DDR test controller 170 of the memory device 100 may transfer the write enable (WE_N) signal received by the pad 163 to the data path logic circuit 180 as the internal write enable (WE_N_INT) signal in the period in which the command and the address are input during the DDR test. Therefore, the DDR write enable (DDR_WE_EN) signal has a high state in the period in which the command and the address are input during the DDR test.

Meanwhile, according to an embodiment of the present disclosure, data may be input to the memory device 100 in synchronization with the internal data strobe (DQS_INT) signal. The DDR test controller 170 of the memory device 100 may transfer the write enable (WE_N) signal received by the pad 163 to the data path logic circuit 180 as the internal data strobe (DQS_INT) signal in the period in which the data is input during the DDR test. Therefore, the DDR write enable (DDR_WE_EN) signal has a low state in the period in which the data is input during the DDR test.

Therefore, according to an embodiment of the present disclosure, the DDR test of the memory device 100 may be performed without using the pad 164 to which the data strobe (DQS) signal is input. Accordingly, the manufacturing cost of the test device capable of performing the DDR test as well as the SDR test of the memory device 100 may be reduced. As a result, the test cost of the memory device 100 may be reduced.

Figure 14:
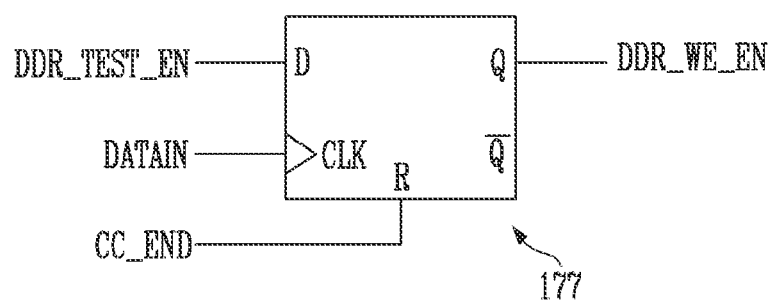
FIG. 14 is a diagram illustrating a flip-flop for generating a DDR write enable signal shown in FIG. 13.

FIG. 14 is a diagram illustrating a flip-flop for generating the DDR write enable signal shown in FIG. 13. In an embodiment, the flip-flop 177 of FIG. 14 may be included in the DDR test controller 170.

Referring to FIG. 14, a DDR test enable (DDR_TEST_EN) signal is input to a data input terminal D of the flip-flop 177. The DDR test enable (DDR_TEST_EN) signal is a signal that controls the memory device 100 to enter the DDR test operation. As an embodiment, when the memory device 100 receives a command for the DDR test operation from the outside, the DDR test enable (DDR_TEST_EN) signal may be activated to high in response to the command.

A data input control (DATAIN) signal is input to a clock input terminal CLK of the flip-flop 177. The data input control (DATAIN) signal may be a signal generated internally in the memory device 100. For example, the input of the "80h" signal and the address signals may be completed and the address latch enable (ALE) signal may be deactivated to low. In response to the address latch enable (ALE) signal that is deactivated to low, the data input control (DATAIN) signal may be activated from low to high. That is, the data input control (DATAIN) signal may be a signal that is activated before data is input after the address is input.

A column count end (CC_END) signal is input to a reset input terminal R of the flip-flop 177. The column count end (CC_END) signal is a signal generated internally in the memory device 100 and may be a signal for counting a column in order to receive data. For example, as shown in FIG. 10, when program data is input in m+1 units, the column count end (CC_END) signal may transit to high after (m+1)/2 clocks are counted. That is, the column count end (CC_END) signal may be a signal that is activated when the input of the program data is completed. Meanwhile, the DDR write enable (DDR_WE_EN) signal is output through an output terminal Q of the flip-flop 177. In some embodiments, m may be a natural number.

Regarding an operation of the flip-flop 177, a signal of the output terminal Q of the flip-flop 177 follows a signal of the data input terminal D at an edge of the signal input to the clock input terminal CLK. In a state in which the signal input to the clock input terminal CLK does not change, the signal of the output terminal Q does not change even though the signal of the data input terminal D changes.

Therefore, the DDR write enable (DDR_WE_EN) signal output to the output terminal Q of the flip-flop 177 follows the DDR test enable (DDR_TEST_EN) signal at an edge of the data input control (DATAIN) signal.

Meanwhile, when the column count end (CC_END) signal input to the reset input terminal R changes from low to high, the signal of the output terminal Q of the flip-flop 177, that is, the DDR write enable (DDR_WE_EN) signal is reset to 0. Hereinafter, the DDR test of the memory device is described with reference to FIG. 15.

Figure 15:
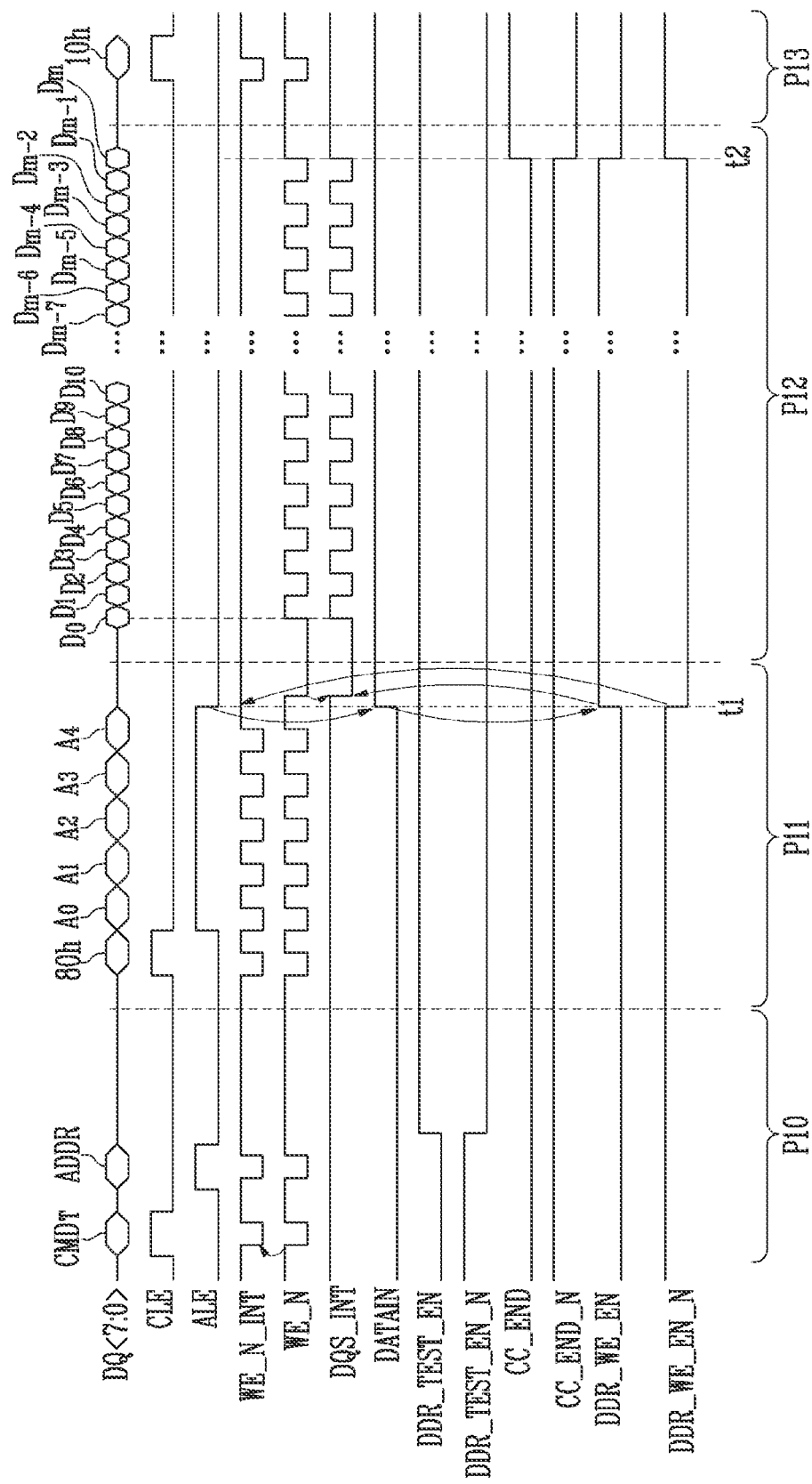
FIG. 15 is a timing diagram for describing the DDR test of the memory device shown in FIG. 11.

FIG. 15 is a timing diagram for describing the DDR test of the memory device shown in FIG. 11.

In a period 10 (P10), a DDR test command CMDT may be input from the outside of the memory device 100. As an example, the DDR test command CMDT may be input by the test device connected to the memory device 100. The DDR test command CMDT may be input by the command latch enable (CLE) signal, and the address ADDR may be input by the address latch enable (ALE) signal. However, this is an example, and the address ADDR might not be input in the period 10 (P10). In the period 10 (P10), the DDR test command CMDT and the address ADDR may be input in synchronization with the internal write enable (WE_N_INT) signal. That is, the DDR test controller 170 may receive the write enable (WE_N) signal and transfer the write enable (WE_N) signal to the data path logic circuit 180 as the internal write enable (WE_N_INT) signal. More specifically, in the period P10, the DDR write enable (DDR_WE_EN) signal is in a low state, and the inverted DDR write enable (DDR_WE_EN_N) signal is in a high state. Therefore, the NAND gate 175 may transfer the write enable (WE_N) signal received through the pad 163 to the data path logic circuit 180 as the internal write enable (WE_N_INT) signal.

In the period 10 (P10), since the DDR write enable (DDR_WE_EN) signal is in the low state, the multiplexer 171 may transfer the signal received from the pad 164 to the data path logic circuit 180 as the internal data strobe (DQS_INT) signal. However, no signal may be input to the pad 164 during the DDR test operation. Therefore, the pad 164 may be in a high impedance (high-z) state. Accordingly, the internal data strobe (DQS_INT) signal may be in a high state.

Meanwhile, in response to the DDR test command CMDT received in the period 10 (10), the DDR test enable (DDR_TEST_EN) signal may transit from a low state to a high state. Meanwhile, an inverted DDR test enable (DDR_TEST_EN_N) signal may transit from a high state to a low state.

In a period 11 (P11), in a state in which the command latch enable (CLE) signal is activated to high, the "80h" signal may be input through the data input/output (DQ<7:0>) line. After the "80h" signal is input, the command latch enable (CLE) signal may be deactivated to low, and the address latch enable (ALE) signal may be activated to high. In a state in which the address latch enable (ALE) signal is activated, the address signals A0 to A4 may be input through the data input/output (DQ<7:0>) line. After the address signals A0 to A4 are input, the address latch enable (ALE) signal may be deactivated to low.

At a time t1, the data input control (DATAIN) signal may be activated to a high state. As described above, the data input control (DATAIN) signal may be activated from low to high in response to the address latch enable (ALE) signal that is deactivated to low. Referring to FIG. 14, at an edge of the data input control (DATAIN) signal input to the clock input terminal CLK of the flip-flop 177, the DDR write enable (DDR_WE_EN) signal follows the DDR test enable (DDR_TEST_EN) signal. Therefore, at the time t1, the DDR write enable (DDR_WE_EN) signal transits to a high state following to the DDR test enable (DDR_TEST_EN) signal.

As the DDR write enable (DDR_WE_EN) signal changes to a high state, the multiplexer 171 of the DDR test controller 170 transfers the write enable (WE_N) signal received from the pad 163 to the data path logic circuit 180 as the internal data strobe DQS_INT. That is, from the time t1, the internal data strobe DQS_INT toggles according to the write enable (WE_N) signal.

Meanwhile, as the DDR write enable (DDR_WE_EN) signal changes to a high state, the inverted DDR write enable (DDR_WE_EN_N) signal changes to a low state. As the inverted DDR write enable (DDR_WE_EN_N) signal changes to the low state, regardless of the write enable (WE_N) signal, from the time t1, the NAND gate 175 generates the internal write enable (WE_N_INT) signal of a high state and transfers the internal write enable (WE_N_INT) signal to the data path logic circuit 180.

In a period 12 (P12), the data D0 to Dm signals are input through the data input/output (DQ<7:0>) line. In the period 12 (P12), the data D0 to Dm signals may be received in synchronization with the internal data strobe DQS_INT. When the last data signal Dm among the data D0 to Dm signals is input, the column count end (CC_END) signal may transit to a high state at a time t2. As the column count end (CC_END) signal transit to the high state, the flip-flop 177 of FIG. 14 is reset. Therefore, the DDR write enable (DDR_WE_EN) signal, which is a signal output from the time t2 to the output terminal Q of the flip-flop 177, changes from a high state to a low state.

As the DDR write enable (DDR_WE_EN) signal changes to the low state, the multiplexer 171 transfers the signal received from the pad 164 to the data path logic circuit 180 as the internal data strobe (DQS_INT) signal. However, no signal may be input to the pad 164 during the DDR test operation. Therefore, the pad 164 may be in a high impedance (high-z) state. Accordingly, the internal data strobe (DQS_INT) signal may become a high state at the time t2.

Meanwhile, as the DDR write enable (DDR_WE_EN) signal changes to a low state, the inverted DDR write enable (DDR_WE_EN_N) signal changes to a high state. Therefore, from the time t2, the NAND gate 175 may transfer the write enable (WE_N) signal received through the pad 163 to the data path logic circuit 180 as the internal write enable (WE_N_INT) signal.

At a period 13 (P13) after data input is completed, the "10h" signal may be input through the data input/output (DQ<7:0>) line in a state in which the command latch enable (CLE) signal is activated to high. Substantially the same as in the period 10 (P10), in the period 13 (P13), the DDR test controller 170 may transfer the write enable (WE_N) signal transferred through the pad 163 to the data path logic circuit 180 as the internal write enable (WE_N_INT) signal. Therefore, in the period 13 (13), the internal write enable (WE_N_INT) signal may toggle identically to the write enable (WE_N) signal. In the period 13 (P13), the "10h" signal may be input in synchronization with the internal write enable signal WE_N_INT.

As described above, according to an embodiment of the present disclosure, the command and the address may be input to the memory device 100 in synchronization with the internal write enable (WE_N_INT) signal. The DDR test controller 170 of the memory device 100 may transfer the write enable (WE_N) signal received by the pad 163 to the data path logic circuit 180 as the internal write enable (WE_N_INT) signal in the period in which the command and the address are input during the DDR test. Therefore, the DDR write enable (DDR_WE_EN) signal has a high state in the period in which the command and the address are input during the DDR test.

Meanwhile, according to an embodiment of the present disclosure, data may be input to the memory device 100 in synchronization with the internal data strobe (DQS_INT) signal. The DDR test controller 170 of the memory device 100 may transfer the write enable (WE_N) signal received by the pad 163 to the data path logic circuit 180 as the internal data strobe (DQS_INT) signal in the period in which the data is input during the DDR test. Therefore, the DDR write enable (DDR_WE_EN) signal has a low state in the period in which the data is input during the DDR test.

Therefore, according to an embodiment of the present disclosure, the DDR test of the memory device 100 may be performed without using the pad 164 to which the data strobe (DQS) signal is input. Accordingly, the manufacturing cost of the test device capable of performing the DDR test as well as the SDR test of the memory device 100 may be reduced. As a result, the test cost of the memory device 100 may be reduced.

Figure 16:
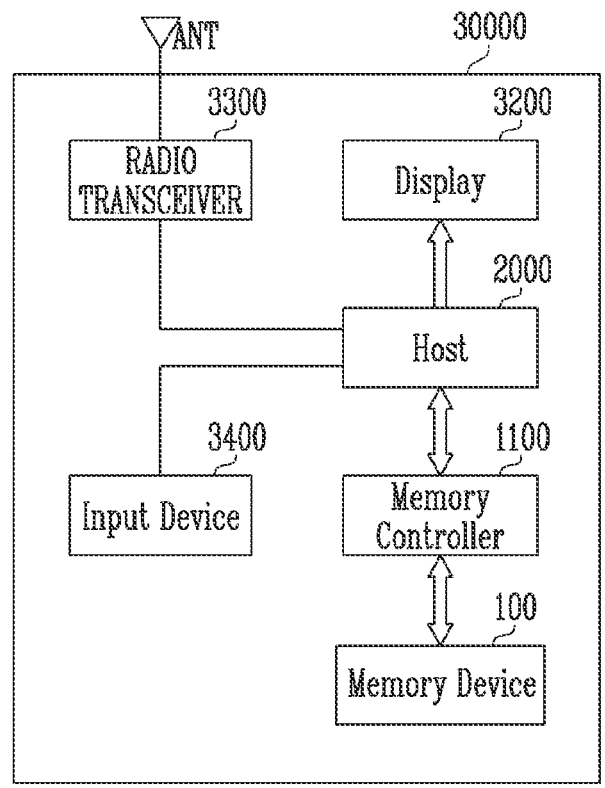
FIG. 16 is a diagram for describing an embodiment of a system including the memory device shown in FIG. 1.

FIG. 16 is a diagram for describing an embodiment of a system including the memory device shown in FIG. 1.

Referring to FIG. 16, the system 30000 may be implemented as a cellular phone, a smart phone, a tablet PC, a personal digital assistant (PDA) or a wireless communication device.

The system 30000 may include the memory device 100 and a memory controller 1100 capable of controlling an operation of the memory device 100. The memory controller 1100 may control a data access operation of the memory device 100, for example, the program operation, the erase operation, or the read operation, under control of a host 2000.

Data programmed in the memory device 100 may be output through a display 3200 under the control of the memory controller 1100.

A radio transceiver 3300 may transmit and receive a radio signal through an antenna ANT. For example, the radio transceiver 3300 may convert a radio signal received through the antenna ANT into a signal that may be processed by the host 2000. Therefore, the host 2000 may process the signal output from the radio transceiver 3300 and transmit the processed signal to the memory controller 1100 or the display 3200. The memory controller 1100 may transmit the signal processed by the host 2000 to the memory device 100. In addition, the radio transceiver 3300 may convert a signal output from the host 2000 into a radio signal, and output the converted radio signal to an external device through the antenna ANT. An input device 3400 may be a device capable of inputting a control signal for controlling the operation of the host 2000 or data to be processed by the host 2000. The input device 3400 may be implemented as a pointing device such as a touch pad or a computer mouse, a keypad, or a keyboard. The host 2000 may control an operation of the display 3200 so that data output from the memory controller 1100, data output from the radio transceiver 3300, or data output from the input device 3400 is output through the display 3200.

Figure 17:
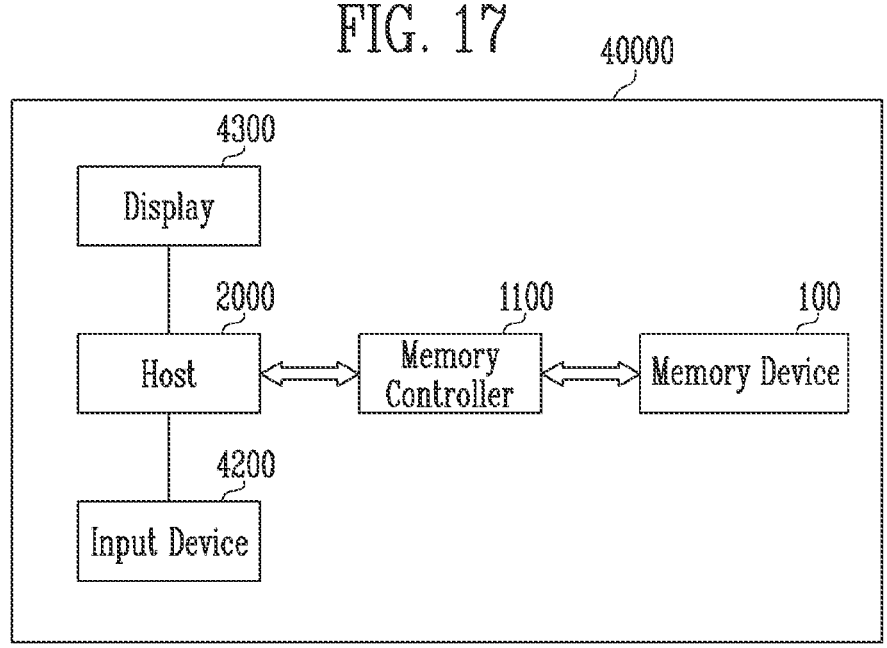
FIG. 17 is a diagram for describing another embodiment of a system including the memory device shown in FIG. 1.

FIG. 17 is a diagram for describing another embodiment of a system including the memory device shown in FIG. 1.

Referring to FIG. 17, the system 40000 may be implemented as a personal computer (PC), a tablet PC, a net-book, an e-reader, a personal digital assistant (PDA), a portable multimedia player (PMP), an MP3 player, or an MP4 player.

The system 40000 may include the memory device 100 and a memory controller 1100 capable of controlling a data process operation of the memory device 4500.

A host 2000 may output data stored in the memory device 100 through a display 4300, according to data input through an input device 4200. For example, the input device 4200 may be implemented as a point device such as a touch pad or a computer mouse, a keypad, or a keyboard.

The host 2000 may control an overall operation of the system 40000 and control an operation of the memory controller 1100.

Figure 18:
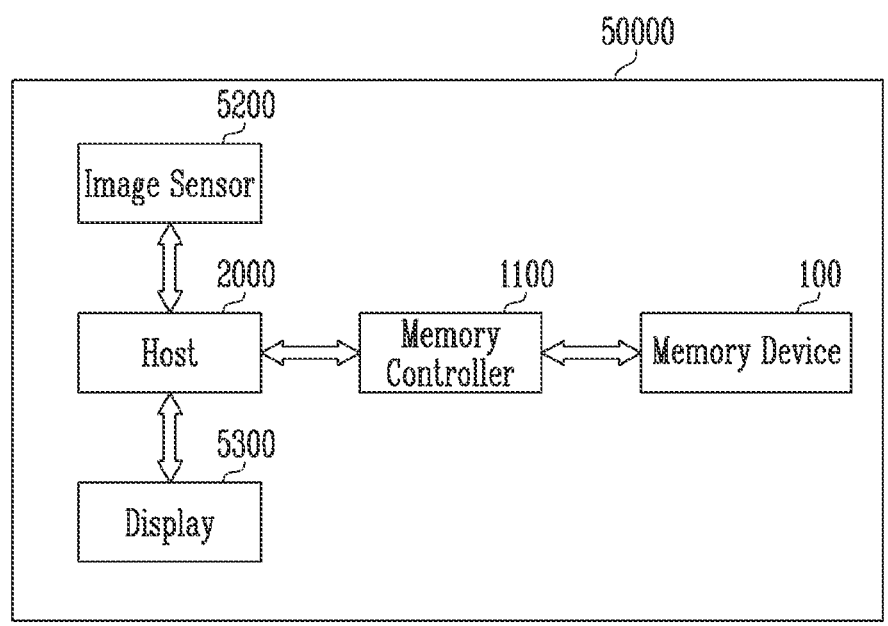
FIG. 18 is a diagram for describing another embodiment of a system including the memory device shown in FIG. 1.

FIG. 18 is a diagram for describing another embodiment of a system including the memory device shown in FIG. 1.

Referring to FIG. 18, the system 50000 may be implemented as an image processing device, for example, a digital camera, a portable phone provided with a digital camera, a smart phone provided with a digital camera, or a tablet PC provided with a digital camera.

The system 50000 may include the memory device 100 and the memory controller 1100 capable of controlling a data process operation, for example, the program operation, the erase operation, or the read operation, of the memory device 100.

An image sensor 5200 of the system 50000 may convert an optical image into digital signals. The converted digital signals may be transmitted to the host 2000. Under control of the host 2000, the converted digital signals may be output through a display 5300 or stored in the memory device 100 through the memory controller 1100. In addition, data stored in the memory device 100 may be output through the display 5300 under the control of the host 2000.

Figure 19:
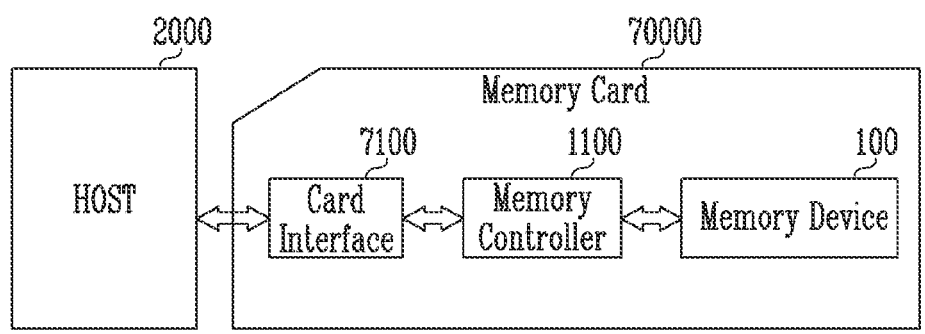
FIG. 19 is a diagram for describing another embodiment of a system including the memory device shown in FIG. 1.

FIG. 19 is a diagram for describing another embodiment of a system including the memory device shown in FIG. 1.

Referring to FIG. 19, the system may include the host 2000 and a memory card 70000.

The memory card 70000 may be implemented as a smart card. The memory card 70000 may include the memory device 100, the memory controller 1100, and a card interface 7100.

The memory controller 1100 may control data exchange between the memory device 100 and the card interface 7100. According to an embodiment, the card interface 7100 may be a secure digital (SD) card interface or a multi-media card (MMC) interface, but is not limited thereto. In addition, the card interface 7100 may interface data exchange between the host 2000 and the memory controller 1100 according to a protocol of the host 2000. According to an embodiment, the card interface 7100 may support a universal serial bus (USB) protocol, and an interchip (IC)-USB protocol. Here, the card interface 7100 may refer to hardware capable of supporting a protocol that is used by the host 2000, software installed in the hardware, or a signal transmission method.

Although the detailed description of the present disclosure describes specific embodiments, various changes and modifications may be made without departing from the scope and technical spirit of the present disclosure. Therefore, the scope of the present disclosure should not be limited to the above-described embodiments, and should be determined by the equivalents of the claims of the present disclosure as well as the following claims.

What is claimed is:

1. A memory device comprising:
a first pad capable of receiving a write enable signal;
a second pad capable of receiving a data strobe signal; and
a double data rate (DDR) test controller connected to the first pad and the second pad and configured to output an internal write enable signal and an internal data strobe signal after receiving the write enable signal,
wherein the DDR test controller generates the internal data strobe signal in response to the write enable signal received through the first pad, in at least a portion of a DDR test operation of the memory device.

2. The memory device of claim 1, wherein the DDR test controller outputs the write enable signal received through the first pad as the internal write enable signal, and outputs the data strobe signal received through the second pad as the internal data strobe signal, during a normal operation of the memory device.

3. The memory device of claim 1, wherein the DDR test controller outputs the write enable signal received through the first pad as the internal write enable signal in a period in which a command or an address is input during the DDR test operation.

4. The memory device of claim 1, wherein the DDR test controller outputs the write enable signal received through the first pad as the internal data strobe signal in a period in which data is input during the DDR test operation.

5. The memory device of claim 1, wherein the DDR test controller comprises:

a multiplexer connected to the first pad and the second pad through an input terminal and configured to output the internal data strobe signal according to control of a DDR write enable signal;

an inverter configured to invert the write enable signal input to the first pad; and a NAND gate configured to perform a NAND operation on an output of the inverter and an inverted DDR write enable signal to generate the internal write enable signal.

6. The memory device of claim 5, wherein the DDR test controller further includes a flip-flop, a DDR test enable signal is input to a data input terminal of the flip-flop, a data input control signal is input to a clock input terminal of the flip-flop, a column count end signal is input to a reset input terminal of the flip-flop, and the DDR write enable signal is output to an output terminal of the flip-flop.

7. The memory device of claim 6, wherein when the memory device receives a command for the DDR test operation, the DDR test enable signal is activated to a high state in response to reception of the command.

8. The memory device of claim 6, wherein when the memory device completes reception of an address signal, the data input control signal is activated to a high state in response to reception completion of the address signal.

9. The memory device of claim 6, wherein when the memory device completes reception of data, the column count end signal is activated to a high state in response to reception completion of the data.

10. The memory device of claim 6, wherein the DDR write enable signal output to the output terminal of the flip-flop follows the DDR test enable signal when the data input control signal transits to high.

11. The memory device of claim 5, wherein the DDR test controller receives a DDR test enable signal in synchronization with a data input control signal to generate the DDR write enable signal.

12. The memory device of claim 1, further comprising:

a data path logic circuit configured to receive the internal write enable signal and the internal data strobe signal and transfer the internal write enable signal and the internal data strobe signal to a control logic.

13. A memory device comprising:

a memory cell array including a plurality of memory cells;

a peripheral circuit configured to perform a program operation, an erase operation, or a read operation on the memory cell array;

a control logic configured to control an operation of the peripheral circuit; and a double data rate (DDR) test controller configured to generate an internal write enable signal and an internal data strobe signal for being transferred to the control logic after receiving signals from a first pad and a second pad, wherein the DDR test controller generates the internal write enable signal in response to a first signal received through the first pad and generates the internal data strobe signal in response to a second signal received through the second pad, during a normal operation of the memory device, and the DDR test controller generates the internal data strobe signal in response to the first signal received through the first pad in at least a portion of the DDR test operation of the memory device.

14. The memory device of claim 13, wherein the DDR test controller generates the internal write enable signal based on the first signal received through the first pad in a period in which a command or an address is input during the DDR test operation.

15. The memory device of claim 13, wherein the DDR test controller generates the internal data strobe signal based on the first signal received through the first pad, in a period in which data is input during the DDR test operation.

16. The memory device of claim 13, wherein the DDR test controller comprises:

a multiplexer connected to the first pad and the second pad through an input terminal and configured to output the internal data strobe signal under control of a third signal;

an inverter configured to invert a signal input to the first pad; and a NAND gate configured to perform a NAND operation on an output of the inverter and an inverted third signal to generate the internal write enable signal.

17. The memory device of claim 16, wherein the DDR test controller further comprises a flip-flop, a fourth signal is input to a data input terminal of the flip-flop, a fifth signal is input to a clock input terminal of the flip-flop, a sixth signal is input to a reset input terminal of the flip-flop, and the third signal is output to an output terminal of the flip-flop.

18. The memory device of claim 17, wherein when the memory device receives a command for the DDR test operation, the fourth signal changes to an active state in response to reception of the command.

19. The memory device of claim 17, wherein when the memory device completes reception of an address signal, the fifth signal changes to an active state in response to reception completion of the address signal.

20. The memory device of claim 17, wherein when the memory device completes reception of data, the sixth signal changes to an active state in response to reception completion of the data.

21. The memory device of claim 17, wherein the third signal output to the output terminal of the flip-flop follows the fourth signal at an edge of the fifth signal.

* * * * *